United States Patent
Abe et al.

(10) Patent No.: US 10,115,828 B2
(45) Date of Patent: Oct. 30, 2018

(54) FIELD-EFFECT TRANSISTOR, DISPLAY ELEMENT, IMAGE DISPLAY DEVICE, AND SYSTEM

(71) Applicants: Yukiko Abe, Kanagawa (JP); Naoyuki Ueda, Kanagawa (JP); Yuki Nakamura, Tokyo (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(72) Inventors: Yukiko Abe, Kanagawa (JP); Naoyuki Ueda, Kanagawa (JP); Yuki Nakamura, Tokyo (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 113 days.

(21) Appl. No.: 15/220,588

(22) Filed: Jul. 27, 2016

(65) Prior Publication Data
US 2017/0033237 A1  Feb. 2, 2017

(30) Foreign Application Priority Data

Jul. 30, 2015 (JP) .................. 2015-151096
Apr. 15, 2016 (JP) .................. 2016-082264

(51) Int. Cl.
*H01L 21/336* (2006.01)
*H01L 21/768* (2006.01)
(Continued)

(52) U.S. Cl.
CPC ..... *H01L 29/78684* (2013.01); *G09G 3/3225* (2013.01); *G09G 3/34* (2013.01);
(Continued)

(58) Field of Classification Search
CPC .............. G09G 3/3225; G09G 3/34; G09G 2300/0819; G09G 2320/045;
(Continued)

(56) References Cited

U.S. PATENT DOCUMENTS 8,268,666 B2  9/2012  Abe et al.
8,956,969 B2  2/2015  Sone et al.
(Continued)

FOREIGN PATENT DOCUMENTS

JP  2010-062546  3/2010
JP  2010-283190  12/2010
(Continued)

OTHER PUBLICATIONS

K. Nomura, H. Ohta, A. Takagi, T. Kamiya, M. Hirano, H.Hosono; "Room-temperature fabrication of transparent flexible thin film transistors using amorphous oxide semiconductors", Nature, vol. 432, Nov. 25, 2004, pp. 488 to 492.
(Continued)

*Primary Examiner* — Michael J Eurice
(74) *Attorney, Agent, or Firm* — Cooper & Dunham LLP

(57) ABSTRACT

A field-effect transistor including: a gate electrode; a source electrode and a drain electrode; an active layer disposed to be adjacent to the source electrode and the drain electrode and including a n-type oxide semiconductor; and a gate insulating layer disposed between the gate electrode and the active layer, wherein the n-type oxide semiconductor undergoes substitutional doping with at least one dopant selected from divalent, trivalent, tetravalent, pentavalent, hexavalent, heptavalent, and octavalent cations, valence of the dopant is
(Continued)

greater than valence of a metal ion constituting the n-type oxide semiconductor, provided that the dopant is excluded from the metal ion, and the source electrode and the drain electrode include a material selected from Au, Pt, and Pd and alloys including at least any one of Au, Pt, and Pd, in at least contact regions of the source electrode and the drain electrode with the active layer.

10 Claims, 17 Drawing Sheets

(51) Int. Cl.
| | | |
|---|---|---|
| H01L 29/24 | (2006.01) | |
| H01L 29/45 | (2006.01) | |
| H01L 29/49 | (2006.01) | |
| H01L 29/78 | (2006.01) | |
| H01L 29/786 | (2006.01) | |
| H01L 51/00 | (2006.01) | |
| H01L 51/30 | (2006.01) | |
| G09G 3/3225 | (2016.01) | |
| G09G 3/34 | (2006.01) | |
| H01L 29/40 | (2006.01) | |
| H01L 29/417 | (2006.01) | |
| H01L 27/12 | (2006.01) | |
| H01L 27/32 | (2006.01) | |
| H01L 21/02 | (2006.01) | |
| H01L 51/05 | (2006.01) | |
| H01L 51/10 | (2006.01) | |
| H01L 27/28 | (2006.01) | |
| H01L 29/66 | (2006.01) | |

(52) U.S. Cl.
CPC ........ *H01L 27/1225* (2013.01); *H01L 29/401* (2013.01); *H01L 29/41733* (2013.01); *H01L 29/45* (2013.01); *H01L 29/7869* (2013.01); *H01L 29/78696* (2013.01); *G09G 2300/0819* (2013.01); *G09G 2320/045* (2013.01); *H01L 21/02554* (2013.01); *H01L 27/1214* (2013.01); *H01L 27/283* (2013.01); *H01L 27/3244* (2013.01); *H01L 27/3248* (2013.01); *H01L 29/24* (2013.01); *H01L 29/4908* (2013.01); *H01L 29/66757* (2013.01); *H01L 29/66765* (2013.01); *H01L 29/66969* (2013.01); *H01L 29/78* (2013.01); *H01L 29/78693* (2013.01); *H01L 51/0512* (2013.01); *H01L 51/0541* (2013.01); *H01L 51/0545* (2013.01); *H01L 51/0558* (2013.01); *H01L 51/105* (2013.01); *H01L 2224/05144* (2013.01); *H01L 2224/05644* (2013.01); *H01L 2924/00* (2013.01); *H01L 2924/01046* (2013.01); *H01L 2924/13063* (2013.01); *H01L 2924/13091* (2013.01); *H01L 2924/15788* (2013.01)

(58) Field of Classification Search
CPC ........... H01L 21/02554; H01L 27/1214; H01L 27/1225; H01L 27/283; H01L 27/3244; H01L 27/3248; H01L 29/24; H01L 29/401; H01L 29/41733; H01L 29/45; H01L 29/4908; H01L 29/66757; H01L 29/66765; H01L 29/66969; H01L 29/78; H01L 29/78684; H01L 29/7869; H01L 29/78693; H01L 29/78696; H01L 51/105; H01L 51/0512; H01L 51/0541
See application file for complete search history.

(56) References Cited

U.S. PATENT DOCUMENTS

| | | | |
|---|---|---|---|
| 9,105,473 B2 | 8/2015 | Ueda et al. | |
| 9,112,039 B2 | 8/2015 | Ueda et al. | |
| 2006/0113549 A1 | 6/2006 | Den et al. | |
| 2008/0197344 A1* | 8/2008 | Yano | H01L 51/0545 257/40 |
| 2008/0308806 A1* | 12/2008 | Akimoto | H01L 27/1225 257/59 |
| 2010/0032667 A1 | 2/2010 | Yamazaki et al. | |
| 2011/0017996 A1 | 1/2011 | Den et al. | |
| 2011/0031499 A1* | 2/2011 | Kimura | H01L 27/1225 257/59 |
| 2011/0057918 A1* | 3/2011 | Kimura | G09G 3/3648 345/211 |
| 2011/0124153 A1 | 5/2011 | Hosoba et al. | |
| 2011/0212569 A1 | 9/2011 | Yamazaki et al. | |
| 2012/0050838 A1 | 3/2012 | Hirano et al. | |
| 2012/0306834 A1* | 12/2012 | Ueda | H01L 21/02565 345/208 |
| 2013/0240881 A1* | 9/2013 | Nakamura | H01L 21/02554 257/43 |
| 2014/0009514 A1* | 1/2014 | Abe | H01L 29/78693 345/690 |
| 2014/0299877 A1 | 10/2014 | Nakamura et al. | |
| 2014/0353648 A1* | 12/2014 | Abe | H01L 29/247 257/40 |
| 2015/0001531 A1* | 1/2015 | Ueda | H01L 27/1225 257/43 |
| 2015/0028334 A1* | 1/2015 | Matsumoto | H01L 23/5328 257/43 |
| 2015/0097181 A1* | 4/2015 | Yamazaki | H01L 29/78696 257/43 |
| 2015/0158300 A1 | 6/2015 | Ueda et al. | |
| 2015/0349138 A1 | 12/2015 | Sone et al. | |
| 2016/0013215 A1* | 1/2016 | Ueda | C09D 5/24 345/204 |
| 2016/0042947 A1* | 2/2016 | Nakamura | H01L 29/66969 257/43 |
| 2016/0133751 A1* | 5/2016 | Nomura | H01L 29/66969 345/520 |
| 2016/0190329 A1* | 6/2016 | Matsumoto | H01L 29/66969 345/55 |
| 2016/0190330 A1* | 6/2016 | Yamazaki | H01L 29/7869 257/43 |
| 2016/0190331 A1* | 6/2016 | Miyake | H01L 29/7869 257/40 |
| 2016/0218223 A1* | 7/2016 | Nomura | H01L 29/66969 |
| 2016/0260836 A1* | 9/2016 | Okazaki | H01L 29/045 |
| 2016/0274394 A1* | 9/2016 | Yamazaki | G02F 1/1368 |
| 2017/0301738 A1* | 10/2017 | Abe | H01L 27/3244 |

FOREIGN PATENT DOCUMENTS

| | | |
|---|---|---|
| JP | 2011-103402 | 5/2011 |
| JP | 2011-129895 | 6/2011 |
| JP | 5118811 | 10/2012 |
| JP | 2013-004555 | 1/2013 |
| JP | 5216883 | 3/2013 |
| JP | 2015-046568 | 3/2015 |
| WO | WO2015/016333 A1 | 2/2015 |

OTHER PUBLICATIONS

European search report dated Nov. 21, 2016 in corresponding European Patent Application No. 16181460.3.

* cited by examiner

Light

FIELD-EFFECT TRANSISTOR, DISPLAY ELEMENT, IMAGE DISPLAY DEVICE, AND SYSTEM

CROSS-REFERENCE TO RELATED APPLICATIONS

The present application claims priority under 35 U.S.C. § 119 to Japanese Patent Application No. 2015-151096, filed Jul. 30, 2015 and Japanese Patent Application No. 2016-082264, filed Apr. 15, 2016. The contents of which are incorporated herein by reference in their entirety.

BACKGROUND OF THE INVENTION

Field of the Invention

The present invention relates to a field-effect transistor, a display element, an image display device, and a system.

Description of the Related Art

Flat panel displays (FPDs), such as liquid crystal displays (LCDs), organic electroluminescent (EL) displays (OLEDs), and electronic paper, are driven by a driving circuit including a thin film transistor (TFT) using amorphous silicon or polycrystalline silicon for an active layer. FPDs have been demanded for further increase in size, higher definition, and high-speed driving performance. In order to meet these demands, there is a need for TFTs having high carrier mobility, small change in characteristics over time, and less variation between elements.

However, TFTs using amorphous silicon (a-Si) or polycrystalline silicon (in particular, low-temperature polysilicon: LTPS) for an active layer have advantages and disadvantages. It is therefore difficult to satisfy all the requirements for the TFTs at the same time.

For example, a-Si TFTs have the following disadvantages. The a-Si TFTs have insufficient mobility for driving a large liquid crystal display (LCD) at high speed and have a large shift in threshold voltage when continuously driven. LTPS-TFTs have large mobility but have large variation in threshold voltage because of a process for crystallizing an active layer by excimer laser annealing. Therefore, there is a problem that a size of mother glass for a mass-production line cannot be enlarged.

In view of the above, proposed is $InGaZnO_4$ (a-IGZO) which can be formed into a film at room temperature and exhibits mobility equal to or higher than mobility of a-Si in an amorphous state (see K. Nomura, 5 others, "Room-temperature fabrication of transparent flexible thin-film transistors using amorphous oxide semiconductors", *NATURE*, VOL 432, No. 25, NOVEMBER, 2004, pp. 488-492). The proposed material has been a trigger for actively studying amorphous oxide semiconductors having high mobility.

However, TFTs using the above oxide semiconductors as active layers have many problems associated with stability of characteristics of TFTs and durability to post processing. In order to organize the problems, these problems are classified into the following two: problems associated with characteristics of oxide semiconductors which are active layers; and problems associated with characteristics of source and drain electrodes.

In order to solve the above-described problems, proposed are techniques of improving an active layer (see, for example, Japanese Unexamined Patent Application Publication No. 2011-129895), techniques of disposing a buffer layer (see, for example, Japanese Patent No. 5118811 and Japanese Unexamined Patent Application Publication No. 2010-62546), techniques of improving source and drain electrodes (see, for example, Japanese Unexamined Patent Application Publication No. 2011-103402), and techniques of using specific n-type oxide semiconductors (see, for example, Japanese Unexamined Patent Application Publication No. 2013-4555).

However, there have not yet been obtained field-effect transistors that use a n-type oxide semiconductor for an active layer, realize excellent TFT characteristics with simple structures, and have excellent post-process durability and operation stability. Therefore, there is a need for such field-effect transistors.

SUMMARY OF THE INVENTION

A field-effect transistor of the present invention includes a gate electrode, which is configured to apply gate voltage, a source electrode and a drain electrode, which are configured to take electric current out, an active layer, which is disposed to be adjacent to the source electrode and the drain electrode and includes a n-type oxide semiconductor, and a gate insulating layer, which is disposed between the gate electrode and the active layer. The n-type oxide semiconductor undergoes substitutional doping with at least one dopant selected from the group consisting of a divalent cation, a trivalent cation, a tetravalent cation, a pentavalent cation, a hexavalent cation, a heptavalent cation, and an octavalent cation. A valence of the dopant is greater than a valence of a metal ion constituting the n-type oxide semiconductor, provided that the dopant is excluded from the metal ion. The source electrode and the drain electrode include a material selected from the group consisting of metals of Au, Pt, and Pd and alloys including at least any one of Au, Pt, and Pd, in at least contact regions of the source electrode and the drain electrode with the active layer.

DESCRIPTION OF THE EMBODIMENTS

Figure 1:
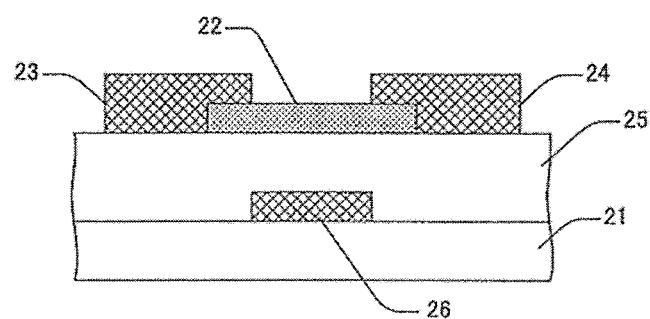
FIG. 1 is a schematic structural view illustrating one example of a top contact/bottom gate field-effect transistor.

Before embodiments of the present invention are described, techniques related to the present invention will be described.

In n-Type oxide semiconductors, such as IGZO, carrier electrons are typically generated from oxygen vacancies. The n-type oxide semiconductors are unstable because characteristics of the n-type oxide semiconductors easily change since they are influenced by oxygen in the atmosphere or in an adjacent layer to an active layer. The carrier electron density decreases, for example, when oxygen in the atmosphere or in the adjacent layer is taken into the active layer. In reverse, the carrier electron density increases when oxygen is taken out from the active layer. TFT characteristics change depending on an increase or decrease in the carrier density and thus operations of TFTs using such oxide semiconductors for active layers are unstable.

In many cases, a passivation layer is disposed for an active layer of an oxide semiconductor. In a display device using a TFT, a display element including a light-emitting layer is disposed on or above the TFT. Accordingly, the TFT is required to have such durability that the characteristics of the TFT are not deteriorated even after such post processing. In particular, durability to post processing including heating is important. If TFT characteristics are deteriorated by oxygen exchange, which is accelerated through heating, between the oxide semiconductor and the exterior (the atmosphere or the adjacent layer), then excellent device characteristics cannot be obtained.

Specifically, there is a need for TFTs having active layers which do not cause deterioration of characteristics as a result of post processing and have excellent operation stability after the production.

For source and drain electrodes, it is desired to use a material having low resistivity and maintaining the low resistivity even after post processing. This is because there is a problem with signal delay caused by resistance from a wired line to a channel of the TFT in a display device configured to display in a screen of a large area. Moreover, it is desired to form excellent electrical contacts between the source and drain electrodes and the active layer. When a non-ohmic contact is formed between the source and drain electrodes and the active layer, the TFT may not operate normally. Moreover, characteristics of the TFT (e.g., an on/off ratio) may be deteriorated when the contact resistance is non-negligibly large as compared with the channel resistance. It is also an essential requirement that the excellent electrical contact is maintained even after a process to be performed after formation of the TFT. In order to achieve the maintained excellent electrical contact, it is not enough to merely consider characteristics of a material for forming the source and drain electrodes, and it is important to consider characteristics of the active layer as well, as described below.

In terms of being low resistance and maintaining the low resistance even after post processing, metals such as Au, Pt, and Pd are excellent as a material for the source and drain electrodes. However, these metals have a large work function. When the work function of the metals is larger than the work function of the n-type oxide semiconductor, there may arise problems such as generation of a Shottoky barrier and an increase in contact resistance. On the other hand, metals (e.g., Al and Ti) having a small work function capable of realizing an excellent electrical contact have low durability to post processing. Such metals may be oxidized after a heating treatment, causing problems including increasing in resistance, increasing in contact resistance with the active layer, and being unable to form an ohmic contact.

As related art having an object to prevent change in characteristics of an active layer to enhance stability of TFTs, disclosed is a technique of turning an oxide semiconductor of an active layer into I-type (intrinsic) (Japanese Unexamined Patent Application Publication No. 2011-129895). The disclosed technique reduces oxygen defects as much as possible by removing impurities from and supplying oxygen to the oxide semiconductor to be a source for generating carriers, and adjusts a carrier density in the active layer to be less than $1 \times 10^{14}/cm^3$, preferably less than $1 \times 10^{12}/cm^3$, and more preferably $1 \times 10^{11}/cm^3$ or less to enhance reliability. However, it has been found from the studies conducted by the present inventors that difficulty is encountered in forming an excellent electrical contact between the source and drain electrodes and the active layer having an extremely low carrier density with a limited contact area. Moreover, when the carrier density is low, on-current (a current value when the TFT is in the state of "on") becomes small. Therefore, in actual, the on-current cannot reach a current value for practical use, unless a current value is gained by extremely shortening a channel length of the TFT and increasing a channel width. The disclosed technique has problems with difficulty in a process for finely pattering a channel length and an increase in TFT size accompanied by enlarging a channel width. Therefore, it cannot be said that the disclosed technique is a practically usable technique.

Meanwhile, as related art for enhancing stability of TFTs using metals having low resistance and high durability for source and drain electrodes, disclosed is a technique of forming a buffer layer of a n-type oxide having a lower resistivity than an active layer, between the electrodes and the active layer (for example, Japanese Patent No. 5118811 and Japanese Unexamined Patent Application Publication No. 2010-62546). The buffer layer can form an excellent electrical contact even when the electrodes use a material having a large work function, and therefore a material such as Au can be used for the source and drain electrodes (see the section "Mode for Carrying out the Invention" in Japanese Patent No. 5118811).

Japanese Unexamined Patent Application Publication No. 2011-103402 discloses a technique of improving a contact by forming source and drain electrodes as a laminate film of Ti and Au and locating Ti, having a small work function, at a side to be in contact with an active layer of a n-type oxide semiconductor. In the above-described related art, a structure of the obtained TFT becomes complicated, raising a problem in that the production process additionally needs a step of forming a buffer layer and a step of forming films of two or more metals and processing the films through photolithography.

According to the Examples of Japanese Unexamined Patent Application Publication No. 2013-4555, it is disclosed that excellent characteristics are obtained by directly laminating (without a buffer layer) source and drain electrodes of Au on an active layer of a n-type oxide semiconductor. However, there is no description regarding durability to post processing in the above document. The specification of Japanese Unexamined Patent Application Publication No. 2013-4555 has descriptions regarding typical materials or formation processes of a passivation layer laminated over a TFT. However, the TFT characteristics described in the Examples are characteristics of the TFT that has not undergone a process for forming a passivation layer, and the TFT characteristics after formation of the passivation layer are not described.

It has been found from the studies conducted by the present inventors that, with the related art, electrical contacts are worsened to deteriorate TFT characteristics after post processing even though excellent electrical contacts between the source and drain electrodes and the active layer of a n-type oxide semiconductor are formed at the time the TFT is formed. For example, in the TFT having a structure using a buffer layer of a low-resistance n-type oxide described in Japanese Patent No. 5118811, when heat is applied in post processing, oxygen is diffused from the active layer having a high oxygen content into the buffer layer to increase resistance of the buffer layer. As a result, a function as the buffer layer is weakened to deteriorate the electrical contacts. In a TFT having a structure where Au electrodes are in contact with the active layer having the characteristics described in Japanese Unexamined Patent Application Publication No. 2013-4555, the contact resistance is increased by heating performed in the atmosphere to significantly reduce an on-current value of the TFT. This increase in the contact resistance is due to an increase in resistance caused by oxygen taken into the active layer as a result of heating, because carrier electrons of the active layer are generated by oxygen defects.

In order to obtain TFTs which can prevent deterioration of TFT characteristics in post processing and have such excellent stability that the characteristics are not changed by continuous operations or a stress test, it is important that characteristics of the active layer do not change and states of the source and drain electrodes do not change (particularly, free from an influence of oxidization). The related art, however, considers only one of these points and has not sufficiently studied securing post-process durability and operation stability of TFTs as a whole. At present, there has not been established yet a technique of obtaining TFTs having characteristics suitable for practical use without a complicated layer structure or a complicated process.

Accordingly, there is a need for n-type oxide TFTs including an active layer of a n-type oxide semiconductor material having semiconductor characteristics that are not deteriorated even after post processing such as heating performed twice or more times and a treatment performed in an oxidizing atmosphere; including source and drain electrodes of a material having low resistance maintained even after the post processing; ensuring excellent electrical contacts between the active layer and the source and drain electrodes without a complicated structure such as a buffer layer; and realizing post-process durability and operation stability of the TFT as a whole by the active layer and the source and drain electrodes each having excellent durability to post processing.

The present invention is an invention that has been accomplished to meet the aforementioned requirements.
(Field-Effect Transistor)

A field-effect transistor of the present invention includes at least a gate electrode, a source electrode, a drain electrode, an active layer, and a gate insulating layer. The field-effect transistor further includes other members according to the necessity.

The present invention has an object to provide a field-effect transistor that uses a n-type oxide semiconductor in an active layer, achieves excellent TFT characteristics with a simple structure, and has excellent post-process durability and operation stability.

The present invention can provide a field-effect transistor that uses a n-type oxide semiconductor in an active layer, achieves excellent TFT characteristics with a simple structure, and has excellent post-process durability and operation stability.
<Gate Electrode>

The gate electrode is not particularly limited and may be appropriately selected depending on the intended purpose, so long as the gate electrode is an electrode configured to apply gate voltage.

A material of the gate electrode is not particularly limited and may be appropriately selected depending on the intended purpose. Examples of the material include: metals (e.g., Mo, Al, Au, Ag, and Cu) and alloys of these metals; transparent conductive oxides such as ITO and ATO; and organic conductors such as polyethylene dioxythiophene (PEDOT) and polyaniline (PANT).

A formation method of the gate electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average thickness of the gate electrode is not particularly limited and may be appropriately selected depending on the intended purpose. However, the average thickness of the gate electrode is preferably from 20 nm through 1 μm, more preferably from 50 nm through 300 nm.

<Gate Insulating Layer>

The gate insulating layer is not particularly limited and may be appropriately selected depending on the intended purpose, so long as the gate insulating layer is an insulating layer disposed between the gate electrode and the active layer.

A material of the gate insulating layer is not particularly limited and may be appropriately selected depending on the intended purpose. Examples of the material include materials that have been already used for mass production (e.g., $SiO_2$, SiON, and SiNx), high-dielectric-constant materials (e.g., $La_2O_3$, $ZrO_2$, and $HfO_2$), and organic materials (e.g., polyimide (PI) and fluororesins).

A formation method of the gate insulating layer is not particularly limited and may be appropriately selected depending on the intended purpose. Examples of the formation method include vacuum film formation processes (e.g., sputtering, chemical vapor deposition (CVD), and atomic layer deposition (ALD)) and printing methods (e.g., spin coating, die coating, and inkjet printing).

An average thickness of the gate insulating layer is not particularly limited and may be appropriately selected depending on the intended purpose. However, the average thickness of the gate insulating layer is preferably from 50 nm through 3 μm, more preferably from 100 nm through 1 μm.

<Active Layer>

The active layer is a layer disposed to be in contact with the source electrode and the drain electrode.

In the field-effect transistor of the present invention, the n-type oxide semiconductor forming the active layer undergoes substitutional doping with at least one dopant selected from the group consisting of a divalent cation, a trivalent cation, a tetravalent cation, a pentavalent cation, a hexavalent cation, a heptavalent cation, and an octavalent cation, and a valence of the dopant is greater than a valence of a metal ion constituting the n-type oxide semiconductor, provided that the dopant is excluded from the metal ion. Note that, the substitutional doping is also referred to as a n-type doping.

In the n-type oxide semiconductor subjected to substitutional doping, part of the metal ion constituting the n-type oxide semiconductor, which is a mother phase, is substituted with a dopant having a valence greater than the metal ion, and extra electrons generated because of the difference in valence are released to serve as n-type conductive carriers. In a case where the carrier electrons generated by such substitutional doping are responsible for semiconductor characteristics, the semiconductor characteristics become more stable. The reason for this is as follows. Specifically, the number of carrier electrons derived from oxygen defects are easily changed by an influence of oxidation-reduction reactions or adsorption of oxygen onto a surface of the film when oxygen is exchanged between the semiconductor and the exterior (the atmosphere or the adjacent layer), whereas the number of carrier electrons derived from substitutional doping is relatively free from an influence of such changes in the state.

Moreover, another advantage is that the number of carrier electrons derived from substitutional doping can be controlled well, and a desired carrier density can be easily achieved. As described above, it is difficult to accurately control the oxygen content or maintain the oxygen content to a predetermined value, because oxygen relatively easily moves in and out of the semiconductor. On the other hand, the number of the carrier electrons derived from the substitutional doping can be easily and accurately controlled based mainly on a choice of a kind of a dopant element and a doping amount.

In the n-type oxide semiconductor subjected to substitutional doping, typically, there coexist carrier electrons derived from oxygen defects and carrier electrons derived from substitutional doping. However, a preferable state of the active layer is a state where oxygen defects are reduced as much as possible and carrier electrons derived from the substitutional doping are responsible for electrical characteristics. Change in the number of carrier electrons in the active layer leads directly to change in characteristics of the transistor. Therefore, the transistor characteristics can be made more stable by reducing contribution of oxygen-defects-derived carrier electrons which can easily be changed in number. Specifically, when carrier electrons responsible for semiconductor characteristics of the active layer are mainly generated by substitutional doping, the number of carrier electrons does not change in post processing to make it possible to obtain a transistor having higher durability.

In order to reduce oxygen defects in the active layer, it is effective to introduce more oxygen into the film during a film formation process of the n-type oxide semiconductor layer. For example, in a case where the n-type oxide semiconductor layer is formed by sputtering, a film having less oxygen defects can be formed by increasing the oxygen concentration in the sputtering atmosphere. In a case where the n-type oxide semiconductor layer is formed by applying and baking a composition, a film having less oxygen defects can be formed by increasing the oxygen concentration in the atmosphere at the time of baking.

Moreover, the amount of the oxygen defects can be reduced depending on the composition of the n-type oxide semiconductor. For example, generation of oxygen defects can be suppressed by introducing a certain amount of a metal element having high affinity to oxygen (e.g., Si, Ge, Zr, Hf, Al, Ga, Sc, Y, La, and alkaline earth metals).

When oxygen defects are reduced as much as possible by the above-described methods, the number of carrier electrons in the n-type oxide semiconductor can be controlled based on a kind of a dopant and a doping amount, and desired semiconductor characteristics can be realized by appropriately determining the kind of the dopant and the doping amount.

The kind of the dopant is preferably selected considering an ionic radius, a coordination number, and an orbital energy. A concentration of the dopant can be appropriately selected depending on a material of the mother phase, the kind of the dopant, a site to be substituted by the dopant, a film formation process, and desired TFT characteristics.

Theoretically, the number of electrons generated through substitution of one atom is a value obtained by subtracting a valence of a metal atom of a mother phase constituting the n-type oxide semiconductor from a valence of a cation that is a dopant. Specifically, the valence of the dopant is preferably greater in order to generate the same number of electrons in a smaller doping amount. Moreover, the difference between the valence of the dopant and the valence of the metal atom constituting the n-type oxide semiconductor is preferably larger. A large amount of the dopant present may be a cause for disturbing a crystal structure or alignments of atoms to interfere with movements of carrier electrons. Accordingly, a preferable embodiment is to generate a necessary and sufficient amount of carrier electrons in as small a doping amount as possible.

Moreover, a preferable embodiment is that a selected dopant has an ionic radius close to a radius of an atom to be substituted. This leads to improvement in substitution efficiency and can prevent an unnecessary dopant not contributing to generation of carriers from deteriorating transistor characteristics.

An efficiency of generating carriers through doping depends on various process conditions at the time of the production of TFTs, and therefore it is also important to select process conditions that can improve the carrier generation efficiency. For example, a desired carrier density can be achieved in a smaller doping amount by appropriately selecting: a temperature of a substrate when a n-type oxide semiconductor layer is formed by sputtering; a baking temperature when a n-type oxide semiconductor layer is formed by coating and baking a composition; and a temperature of annealing performed after formation of the n-type oxide semiconductor layer.

A concentration of the dopant is not particularly limited and may be appropriately selected depending on the intended purpose. In view of mobility and rising property of the field-effect transistor, the concentration of the dopant is preferably from 0.01 mol % through 10 mol %, more preferably from 0.01 mol % through 5 mol %, and particularly preferably from 0.05 mol % through 2 mol %. Here, "mol %" denotes a ratio of an amount by mole of the dopant relative to a sum (i.e., 100%) of an amount by mole of the metal element to be substituted in a semiconductor (specifically, an amount by mole of the metal ion to be substituted with the dopant in the n-type oxide semiconductor) and the amount by mole of the dopant. By adjusting the doping amount to the above range and appropriately setting process conditions, the carrier density of the oxide semiconductor can be adjusted to $1.0 \times 10^{18}$ cm$^{-3}$ or greater and the carrier mobility can be adjusted to 0.1 cm$^2$/Vs or greater. The above carrier density and the above carrier mobility are characteristics that are preferable as the active layer of the transistor of the present invention. In particular, the carrier density of the active layer being $1.0 \times 10^{18}$ cm$^{-3}$ or greater and more preferably $5.0 \times 10^{18}$ cm$^{-3}$ or greater is advantageous in that excellent electrical contacts can be formed between the active layer and the electrodes of the transistor in the present invention to make it possible to obtain TFT characteristics of a high on/off ratio.

The n-type oxide semiconductor forming an active layer is preferably in a state of monocrystalline or polycrystalline in order for substitutional doping to effectively work. Even in a case where diffraction peaks from the n-type oxide semiconductor are not observed by X-ray diffraction (XRD) and a long-distance order is not present (typically such a state is referred to as an amorphous state), the n-type oxide semiconductor preferably has a rigid structure where atoms are aligned orderly in a short distance. The above-described structure is preferable for the following reason. Specifically, in the case where an oxide semiconductor to be a mother phase is a highly amorphous material, the structure is changed to a locally stable state and carriers are not generated even after substitutional doping. In the case of the oxide having the rigid structure, oxygen-coordinating polyhedrons (e.g., $WO_6$ or $InO_6$ octahedrons) and their linking manners (e.g., $InO_6$ edge-sharing chains) are maintained, and substitutional doping effectively works. In this structure, a density of tail states unique to the amorphous state is small and therefore sub-gap absorption is small. As a result, photodeterioration of the material having the above structure is smaller than highly amorphous materials.

Doping is similarly effective on the n-type oxide semiconductor even in a monocrystalline or polycrystalline state in which a long-distance order is present. In a case where conduction bands are formed with 4 s, 5 s, and 6 s bands of heavy metal ions, an influence from grain boundaries is small, and excellent characteristics are obtained even in a polycrystalline state. In a case where a doping amount is excessive and the dopant is segregated at grain boundaries, it is preferable to lower the concentration of the dopant. It is also preferable to perform post annealing at a temperature of from 200° C. through 300° C. in order to improve adhesion and electrical contacts at an interface between the source and drain electrodes and the active layer. Moreover, annealing may be performed at a higher temperature to enhance crystallinity.

An average thickness of the active layer is not particularly limited and may be appropriately selected depending on the intended purpose. However, the average thickness of the active layer is preferably from 5 nm through 1 μm, more preferably from 10 nm through 0.5 μm.

According to the studies conducted by the present inventors, when an oxide including at least one selected from the group consisting of In, Zn, Sn, and Ti is selected as a mother phase of the n-type oxide semiconductor, substitutional doping more effectively works to obtain more excellent transistor characteristics.

It is effective to include an element having high affinity to oxygen in the active layer for the purpose of reducing oxygen defects, as described above. It has been found that the element having high affinity to oxygen is suitably Si, Ge, Zr, Hf, Al, Ga, Sc, Y, La, or an alkaline earth metal.

A formation method of the active layer is not particularly limited and may be appropriately selected depending on the intended purpose.

The substitutional doping can be easily performed by adding a raw material of the dopant to a raw material of a mother layer when the active layer is formed. For example, in a case where an active layer is formed by sputtering, it may be possible to use a target including a mother phase to which a dopant element has been added at a predetermined concentration. In a case where a predetermined doping amount is small (e.g., 0.2 mol % or less), however, it is difficult to uniformly include such a small amount of atoms at an accurate value in the entire target.

In view of control of a doping amount, it is a preferable manner to form an active layer through a coating process. In the coating process, a composition for producing a n-type oxide semiconductor including a semiconductor-raw-material compound, a compound including an element to be the dopant (dopant-element-including compound), and a solvent is applied onto an object to be coated through coating, and the applied composition is baked to form an active layer. When a mixing ratio of the dopant-element-including compound to the semiconductor-raw-material compound is allowed to correspond to a desired doping amount in the composition, desired doping can be realized. In the form of the above composition, it is easy to add the dopant-element-including compound to the composition at a very small ratio (i.e., 0.2 mol % or less) as a doping amount and homogeneously stir the resultant composition. Therefore, it can be said that the coating process is more suitable as a formation method of a n-type oxide semiconductor subjected to substitutional doping.

In the field-effect transistor of the present invention, the above-described n-type oxide semiconductor is used for an active layer and electron carriers responsible for semiconductor characteristics are mainly generated by substitutional doping rather than oxygen defects. Even if an oxygen content in the active layer is changed by post processing such as heating performed twice or more times or a treatment performed in an oxidizing atmosphere, semiconductor characteristics are less influenced by the change in the oxygen content. As a result, it is possible to realize a transistor having high durability to post processing and excellent operation stability.

<Source Electrode and Drain Electrode>

The source electrode and the drain electrode are electrodes configured to take electric current out.

In the field-effect transistor of the present invention, the source electrode and the drain electrode include a material selected from the group consisting of metals of Au, Pt, and Pd and alloys including at least any one of Au, Pt, and Pd, in at least contact regions of the source electrode and the drain electrode with the active layer. The above-listed materials have such properties that are not easily oxidized. Therefore, use of any of the above-listed materials can avoid any influence derived from post processing.

The alloy is preferably an alloy including X as a main component (X=Au, Pt, and Pd). The alloy is preferably the following:

Alloys including X in an amount of 50 at. % or greater; and

Ternary or higher alloys where X is an element occupying the largest compositional ratio.

In a field-effect transistor using a conventional oxide semiconductor (oxygen deficient oxide semiconductor) as an active layer, only metals or metal oxides having a low work function (e.g., Al, Ti, and ITO) can be used as a material for the source electrode and the drain electrode in order to achieve excellent electrical contacts between the active layer and the source electrode and drain electrodes. The field-effect transistor of the present invention, however, can use the electrode material having a high work function as described above. The active layer includes the n-type oxide semiconductor subjected to substitutional doping and electron carriers are efficiently and stably generated, and therefore excellent electrical contacts between the active layer and the electrodes can be formed even when the electrodes are made of the electrode material having a high work function. Accordingly, the above-described materials can be used for the source and drain electrodes.

It is described above that change in characteristics after post processing can be suppressed by forming the active layer of a n-type oxide in which carrier electrons are mainly generated through substitutional doping. However, it is not enough to merely consider characteristics of the active layer, in order to enhance durability to post processing and operation stability of the field-effect transistor. First, durability of the source electrode and the drain electrode themselves needs to be high. The field-effect transistor of the present invention has high durability because the source electrode and the drain electrode include a material that is not easily oxidized, and the resistivity of the source electrode and the drain electrode is kept low even after a heating treatment or a treatment performed in an oxidizing atmosphere. Moreover, an interface between the source electrode and the active layer and an interface between the drain electrode and the active layer are formed of the electrode material having high oxidization resistance and the oxide semiconductor subjected to substitutional doping, which makes it possible to obtain an effect that contact resistance is sufficiently small and such excellent electrical contact is maintained without being changed.

With the above-described structure of the transistor, ohmic contacts are preferably formed between the source electrode and the active layer and between the drain electrode and the active layer. The state of the contact influences output characteristics of the transistor around Vds~0V. When the formed contacts are non-ohmic contacts, the output characteristics around Vds~0V deviate from a straight line, making it impossible to obtain normal outputs. A preferable embodiment is that the ohmic contact is maintained even after post processing or continuous operations.

A formation method of the source electrode and the drain electrode is not particularly limited and may be appropriately selected depending on the intended purpose. Examples of the formation method include the same formation methods as described for the gate electrode.

An average thickness of the source electrode and the drain electrode is not particularly limited and may be appropriately selected depending on the intended purpose. However, the average thickness of the source electrode and the drain electrode is preferably from 20 nm through 1 μm and more preferably from 50 nm through 300 nm.

<Insulating Layer>

A structure where the insulating layer is disposed on at least one of the source electrode, the drain electrode, and the active layer is also a preferable embodiment of the field-effect transistor having stable characteristics. In many cases, the insulating layer plays a role of a so-called passivation layer that prevents the source electrode, the drain electrode, and the active layer from changing in characteristics by being directly exposed to oxygen or moisture in the atmosphere. In a display device using the field-effect transistor, a display element including a light-emitting layer may be disposed on or above the transistor. In this case, the insulating layer may also function as a so-called leveling film that absorbs level differences corresponding to a shape of the transistor to level the surface.

A material of the insulating layer is not particularly limited and may be appropriately selected depending on the intended purpose. Examples of the material include materials that have already been widely used for mass production (e.g., $SiO_2$, SiON, and SiNx) and organic materials (e.g., polyimide (PI) and fluororesins).

In the production of a transistor including the insulating layer disposed, the transistor undergoes a process for forming the insulating layer. In subsequent processing, the transistor is exposed to an oxidizing atmosphere or is heated, and exchange of oxygen with the exterior (the atmosphere or the adjacent layer) is accelerated. Therefore deterioration of the transistor characteristics may be caused. However, the field-effect transistor of the present invention uses, for the active layer, the substitutional-doped n-type oxide semiconductor in which the number of carrier electrons is not easily changed even though the degree of oxidation changes. In addition, the source and drain electrodes are formed of a material that does not increase in resistivity due to oxidization. Furthermore, combining these active layer, source electrode, and drain electrode together can maintain excellent electrical contact between the active layer and the electrodes. Accordingly, the field-effect transistor is not deteriorated in the characteristics even after the post processing and has excellent operation stability after the production.

Figure 2:
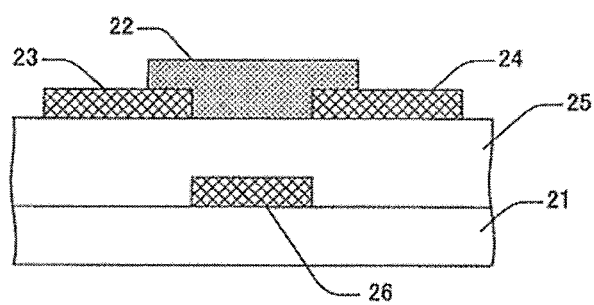
FIG. 2 is a schematic structural view illustrating one example of a bottom contact/bottom gate field-effect transistor.
Figure 3:
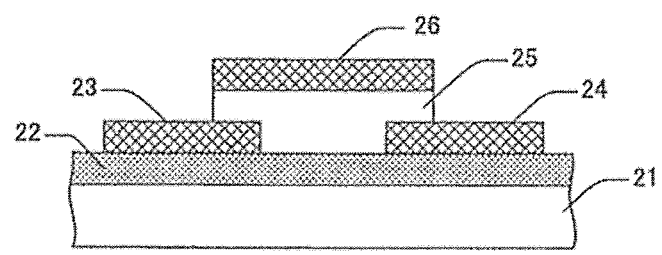
FIG. 3 is a schematic structural view illustrating one example of a top contact/top gate field-effect transistor.
Figure 4:
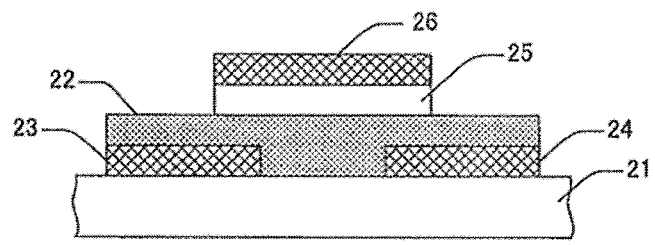
FIG. 4 is a schematic structural view illustrating one example of a bottom contact/top gate field-effect transistor.

A structure of the field-effect transistor is not particularly limited and may be appropriately selected depending on the intended purpose. Examples of the structure of the field-effect transistor include a top contact/bottom gate field-effect transistor (FIG. 1), a bottom contact/bottom gate field-effect transistor (FIG. 2), a top contact/top gate field-effect transistor (FIG. 3), and a bottom contact/top gate field-effect transistor (FIG. 4).

In FIGS. 1 to 4, reference numeral 21 denotes a base, reference numeral 22 denotes an active layer, reference numeral 23 denotes a source electrode, reference numeral 24 denotes a drain electrode, reference numeral 25 denotes a gate insulating layer, and reference numeral 26 denotes a gate electrode.

The field-effect transistor can suitably be used for display elements described below, but use of the field-effect transistor is not limited to display elements. For example, the field-effect transistor can be used for IC cards and ID tags.

<Production Method of Field-Effect Transistor>

In the production method of the field-effect transistor, it is preferable to apply a composition for producing a n-type oxide semiconductor and bake the applied composition to form the n-type oxide semiconductor.

The composition for producing a n-type oxide semiconductor includes a semiconductor-raw-material compound, a dopant-element-including compound, and a solvent. The semiconductor-raw-material compound includes a metal element constituting the n-type oxide semiconductor, provided that the dopant is excluded from the metal element, and the dopant-element-including compound includes an element to be the dopant.

The semiconductor-raw-material compound is not particularly limited and may be appropriately selected depending on the intended purpose. However, the semiconductor-raw-material compound is preferably at least one selected from the group consisting of inorganic salts, oxides, hydroxides, organic acid salts, organic metals, and metal complexes.

The dopant-element-including compound is not particularly limited and may be appropriately selected depending on the intended purpose. However, the dopant-element-including compound is preferably at least one selected from the group consisting of inorganic salts, oxides, hydroxides, organic acid salts, organic metals, and metal complexes.

The solvent is not particularly limited and may be appropriately selected depending on the intended purpose. However, the solvent is preferably an organic solvent. The organic solvent is preferably glycol ethers or diols.

In the method for producing the field-effect transistor, it is preferable to apply a coating liquid in a droplet discharging system and bake the applied coating liquid to form the source electrode and the drain electrode. This method is a preferable method because an electrode can be formed of a desired material in an extremely simple process.

The coating liquid includes at least one metal compound selected from the group consisting of metal particles, alloy particles, metal complexes, metal salts, and organic metal compounds.

The metal compound includes a metal element; i.e., at least one selected from the group consisting of Au, Pt, and Pd.

One example of the method for producing the field-effect transistor will be described.

First, a gate electrode is formed on a base.

A shape, a structure, and a size of the base are not particularly limited and may be appropriately selected depending on the intended purpose.

A material of the base is not particularly limited and may be appropriately selected depending on the intended purpose. Examples of the material include glass and plastics.

The glass is not particularly limited and may be appropriately selected depending on the intended purpose. Examples of the glass include non-alkali glass and silica glass.

The plastics are not particularly limited and may be appropriately selected depending on the intended purpose. Examples of the plastics include polycarbonate (PC), polyimide (PI), polyethylene terephthalate (PET), and polyethylene naphthalate (PEN).

Note that, pre-treatments, such as oxygen plasma, UV ozone, and UV radiation washing, are preferably performed on the base to clean a surface of the base and improve adhesiveness.

Subsequently, a gate insulating layer is formed on the gate electrode.

Subsequently, an active layer of a n-type oxide semiconductor is formed in a channel region and on the gate insulating layer.

Subsequently, a source electrode and a drain electrode are formed on the gate insulating layer to be spaced from each other so as to be across the active layer.

In the above-described manner, the field-effect transistor is produced. According to the above-described production method, for example, a top contact/bottom gate field-effect transistor as illustrated in FIG. 1 is produced.

According to the field-effect transistor of the present invention using a n-type oxide semiconductor as an active layer, when the n-type oxide semiconductor undergoes substitutional doping with at least one dopant selected from the group consisting of a divalent cation, a trivalent cation, a tetravalent cation, a pentavalent cation, a hexavalent cation, a heptavalent cation, and an octavalent cation, and a valence of the dopant is greater than a valence of a metal ion constituting the n-type oxide semiconductor, provided that the dopant is excluded from the metal ion, a change in semiconductor characteristics is suppressed during post processing including a heating treatment and a treatment in an oxidizing atmosphere to prevent deterioration of TFT characteristics. Moreover, the source electrode and the drain electrode include a material selected from the group consisting of metals of Au, Pt, and Pd and alloys including at least any one of Au, Pt, and Pd, in at least contact regions of the source electrode and the drain electrode with the active layer, and the material has such properties that are not easily oxidized. Therefore, a TFT having excellent electrical contact between the source and drain electrodes and the active layer even after post processing is obtained. Here, an alloy including X (X=Au, Pt, or Pd) is, for example, an alloy including X as a main component. For example, the alloy including X is an alloy including X in an amount of 50 at. % or greater or a ternary or higher alloy where X is an element occupying the largest compositional ratio. Although the materials for forming the source and the drain electrodes may include other materials than the material that is not easily oxidized, a preferable embodiment is that the material responsible for electrical characteristics of the electrode is the material that is not easily oxidized. Use of such a material is preferable because electrical characteristics of the electrodes and characteristics of the transistor are maintained even when characteristics of portions other than the above-described material that is not easily oxidized are changed through oxidization. In order to sufficiently exhibit an effect of forming excellent electrical contacts between the active layer and the source electrode and between the active layer and the drain electrode, preferably, the material that is not easily oxidized is present in portions of their contact regions at the side of the source and drain electrodes, and these portions are mainly responsible for conduction between the source and drain electrodes and the active layer. To this end, the material that is not easily oxidized needs to be in contact with the active layer in an area having an effective size. For example, the area of the portions where the material that is not easily oxidized is present is preferably ¼ or greater and more preferably ½ or greater relative to the total area of the portions where the source and drain electrodes are in contact with the active layer. When the semiconductor subjected to the substitutional doping and the above-described metal or alloy that is not easily oxidized are in contact with each other, excellent electrical contacts between the active layer and the source and drain electrodes can be formed. In addition, such an excellent state of the electrical contacts is maintained even after post processing, making it possible to obtain a TFT having excellent post-process durability and operation stability.

(Display Element)

A display element of the present invention includes at least a light control element and a driving circuit configured to drive the light control element. The display element further includes other members according to the necessity.

<Light Control Element>

The light control element is not particularly limited and may be appropriately selected depending on the intended purpose, so long as the light control element is an element configured to control a light output according to a driving signal. Examples of the light control element include electroluminescent (EL) elements, electrochromic (EC) elements, liquid crystal elements, electrophoretic elements, and electrowetting elements.

<Driving Circuit>

The driving circuit is not particularly limited and may be appropriately selected depending on the intended purpose, so long as the driving circuit includes the field-effect transistor of the present invention.

<Other Members>

The other members are not particularly limited and may be appropriately selected depending on the intended purpose.

The display element includes the field-effect transistor of the present invention. Therefore, the display element achieves high-speed driving and a long service life, and can reduce variation within elements. Moreover, the driving transistor can be operated at a constant gate voltage even when the display element has changed in performances over time.

(Image Display Device)

An image display device of the present invention includes at least a plurality of display elements, a plurality of wired lines, and a display control device. The image display device further includes other members according to the necessity.

<Display Elements>

The plurality of display elements are not particularly limited and may be appropriately selected depending on the intended purpose, so long as the plurality of display elements are the display elements of the present invention arranged in a form of matrix.

<Wired Lines>

The plurality of wired lines are not particularly limited and may be appropriately selected depending on the intended purpose, so long as the plurality of wired lines are wired lines configured to individually apply gate voltage and signal voltage to the field-effect transistors in the plurality of display elements.

<Display Control Device>

The display control device is not particularly limited and may be appropriately selected depending on the intended purpose, so long as the display control device is a device configured to individually control the gate voltage and the signal voltage of the field-effect transistors via the plurality of wired lines according to the image data.

<Other Members>

The other members are not particularly limited and may be appropriately selected depending on the intended purpose.

Variation between the elements can be suppressed and high-quality images can be displayed with a large display because the image display device includes the display elements of the present invention.

(System)

A system of the present invention includes at least the image display device of the present invention and an image-data-generating device.

The image-data-generating device is configured to generate image data based on image information to be displayed and to output the image data to the image display device.

Image information can be displayed with high definition because the system includes the image display device of the present invention.

The display element, the image display device, and the system of the present invention are described below with reference to the drawings.

Figure 5:
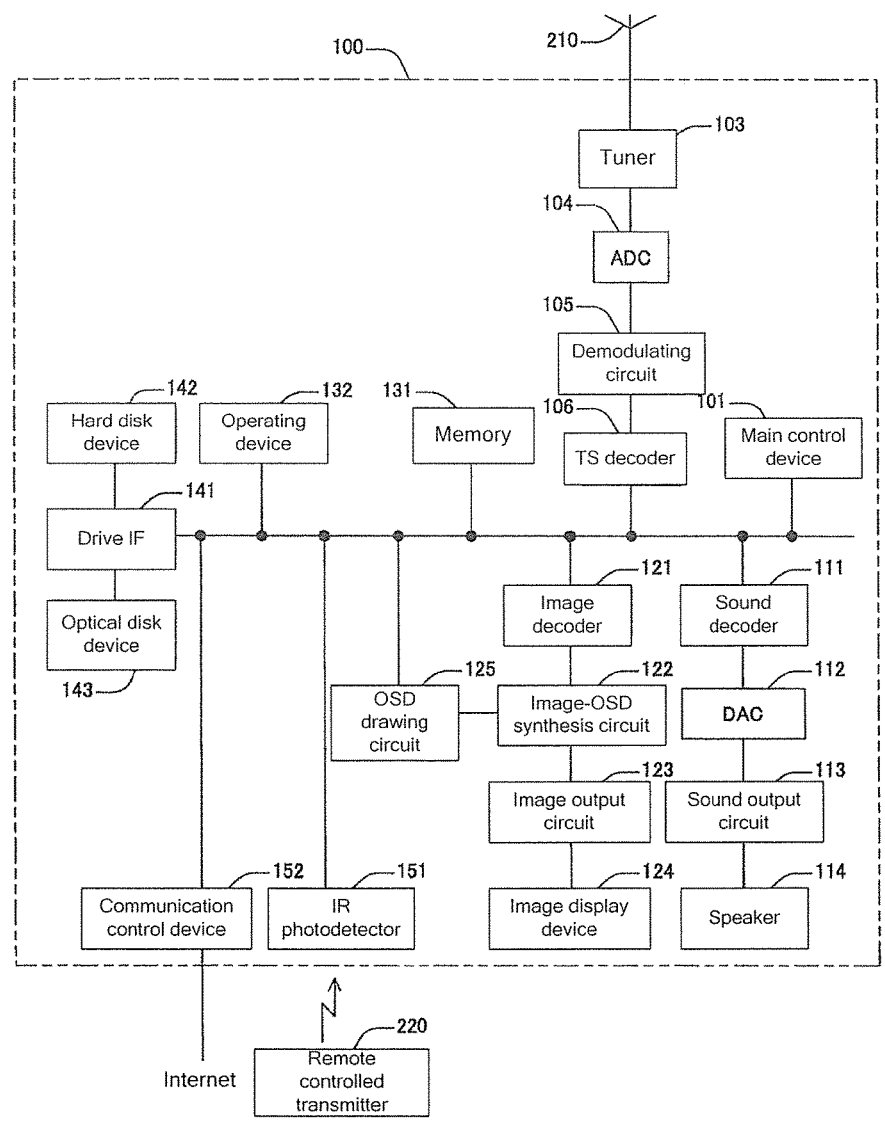
FIG. 5 is a schematic structural diagram illustrating one example of a television device as a system of the present invention.

First, a television device is described as the system of the present invention with reference to FIG. 5. Note that, the structure illustrated in FIG. 5 is one example, and a structure of the television device as the system of the present invention is not limited to the structure illustrated in FIG. 5.

In FIG. 5, a television device 100 includes a main control device 101, a tuner 103, an AD converter (ADC) 104, a demodulating circuit 105, a transport stream (TS) decoder 106, a sound decoder 111, a DA converter (DAC) 112, a sound output circuit 113, a speaker 114, an image decoder 121, an image-OSD synthesis circuit 122, an image output circuit 123, an image display device 124, an OSD drawing circuit 125, a memory 131, an operating device 132, a drive interface (drive IF) 141, a hard disk device 142, an optical disk device 143, an IR photodetector 151, and a communication control unit 152.

The image decoder 121, the image-OSD synthesis circuit 122, the image output circuit 123, and the OSD drawing circuit 125 constitute the image-data-generating device.

The main control device 101 includes a CPU, a flash ROM, and a RAM. The main control device 101 is configured to control the entirety of the television device 100.

The flash ROM stores, for example: a program written with a code that can be decoded with the CPU; and various data used in processing with the CPU.

Also, the RAM is a memory for operation.

The tuner 103 is configured to select a pre-set channel from the broadcast waves received by an antenna 210.

The ADC 104 is configured to convert the output signal (analog information) of the tuner 103 into digital information.

The demodulating circuit 105 is configured to demodulate the digital information from the ADC 104.

The TS decoder 106 is configured to TS decode the output signal of the demodulating circuit 105 to separate the output signal into sound information and image information.

The sound decoder 111 is configured to decode the sound information from the TS decoder 106.

The DA converter (DAC) 112 is configured to convert the output signal of the sound decoder 111 into an analog signal.

The sound output circuit 113 is configured to output the output signal of the DA converter (DAC) 112 to the speaker 114.

The image decoder 121 is configured to decode the image information from the TS decoder 106.

The image-OSD synthesis circuit 122 is configured to synthesize an output signal of the image decoder 121 and an output signal of the OSD drawing circuit 125.

The image output circuit 123 is configured to output the output signal of the image-OSD synthesis circuit 122 to the image display device 124.

The OSD drawing circuit 125 includes a character generator configured to display characters or graphics on a screen of the image display device 124. The OSD drawing circuit 125 is configured to generate a signal including display information according to the instructions from the operating device 132 and the IR photodetector 151.

The memory 131 is configured to temporarily store audio-visual (AV) data.

The operating device 132 includes an input medium (not illustrated) such as a control panel. The operating device 132 is configured to inform various information, which has been input by a user, to the main control device 101.

The drive IF 141 is an interactive communication interface. One example of the drive IF 141 is according to AT attachment packet interface (ATAPI).

The hard disk device 142 includes, for example, a hard disk and a driving device configured to drive the hard disk. The driving device is configured to record data on the hard disk and reproduce the data recorded on the hard disk.

The optical disk device 143 is configured to record data on an optical disk (e.g., a DVD) and reproduce the data recorded on the optical disk.

The IR photodetector 151 is configured to receive a photosignal from a remote-controlled transmitter 220 and report the received photosignal to the main control device 101.

The communication control unit 152 is configured to control communication with the Internet. Various kinds of information can be obtained via the Internet.

Figure 6:
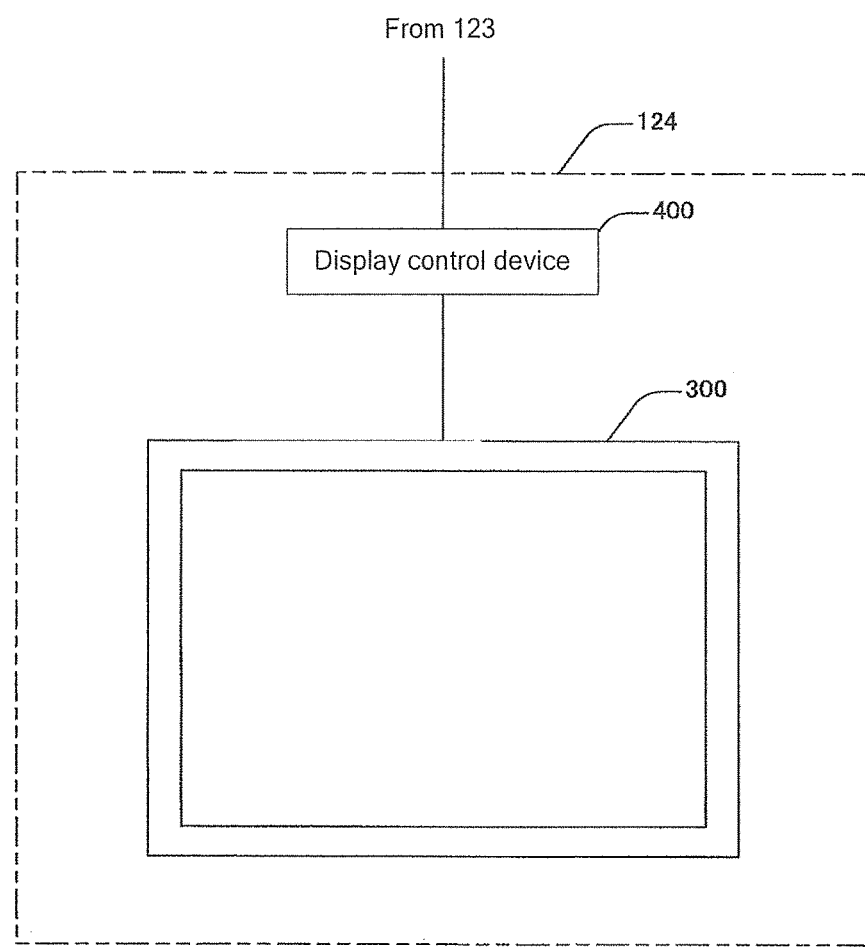
FIG. 6 is a diagram for presenting an image display device in FIG. 5 (part 1)

FIG. 6 is a schematic structural view illustrating one example of the image display device of the present invention.

In FIG. 6, the image display device 124 includes a display unit 300 and a display control device 400.

Figure 7:
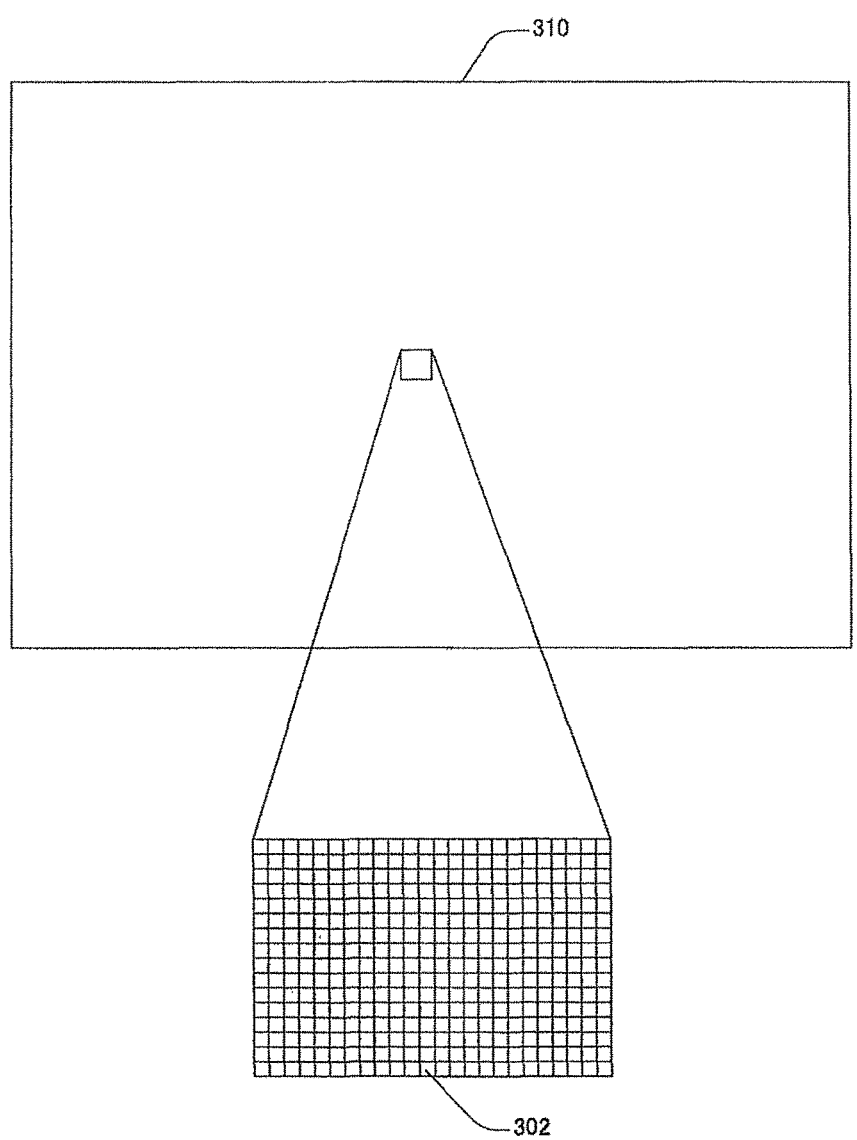
FIG. 7 is a view for presenting an image display device in FIG. 5 (part 2)

As illustrated in FIG. 7, the display unit 300 includes a display 310 in which a plurality of display elements 302 are arranged in a form of matrix (the number "n"×the number "m" in FIG. 7).

Figure 8:
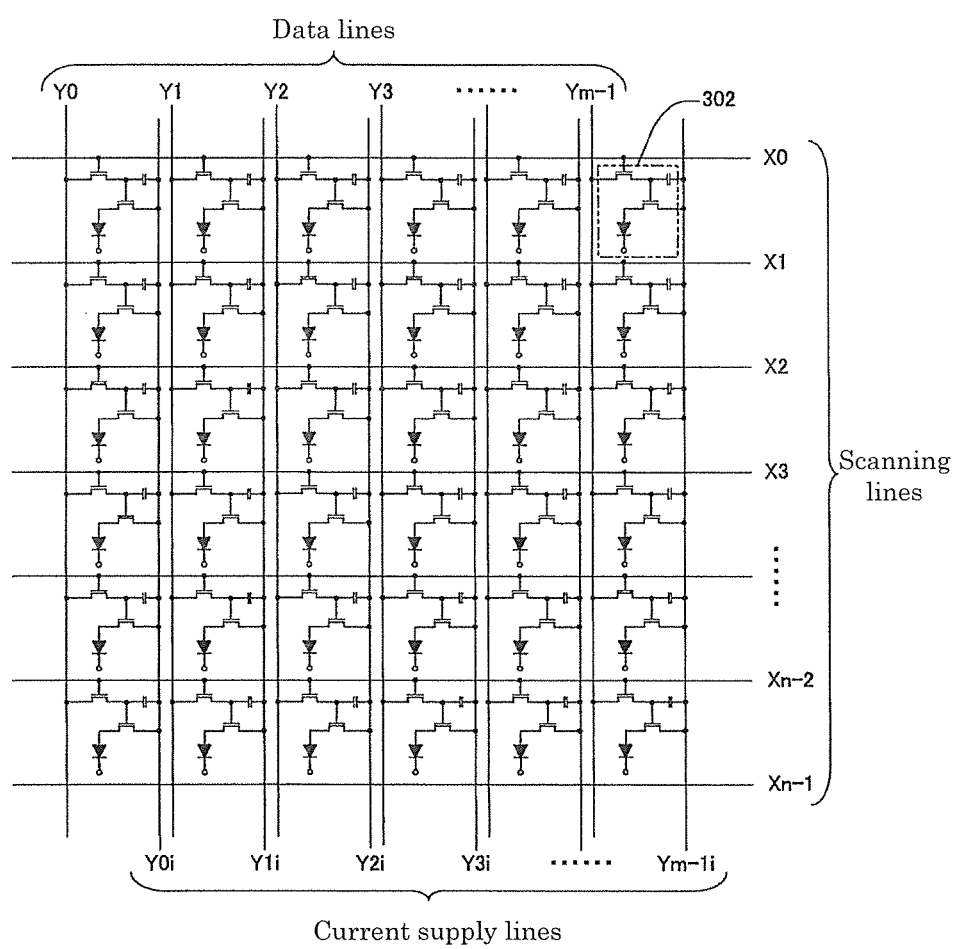
FIG. 8 is a diagram for presenting an image display device in FIG. 5 (part 3)

As illustrated in FIG. 8, the display 310 includes "n" scanning lines (X0, X1, X2, X3, . . . Xn−2, Xn−1) arranged along the X axis direction at constant intervals, "m" data lines (Y0, Y1, Y2, Y3, . . . Ym−1) arranged along the Y axis direction at constant intervals, and "m" current supply lines (Y0$i$, Y1$i$, Y2$i$, Y3$i$, . . . Ym−1i) arranged along the Y axis direction at constant intervals.

Each of the display elements can be identified by each of the scanning lines and each of the data lines.

The display element of the present invention will be described below with reference to FIG. 9.

Figure 9:
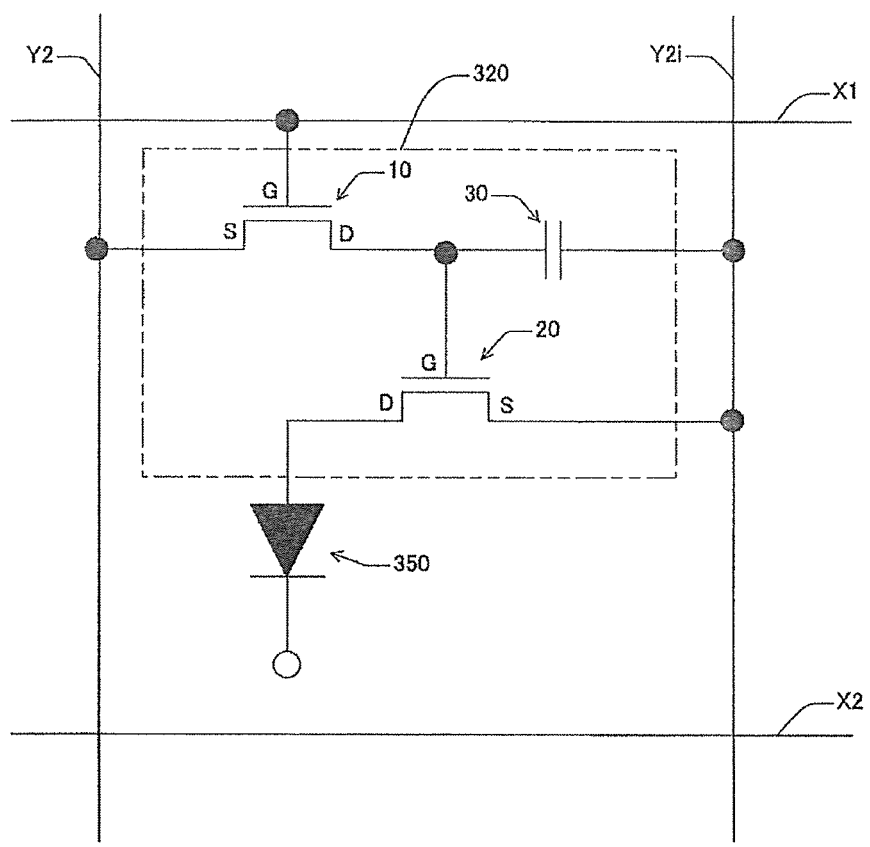
FIG. 9 is a diagram for presenting one example of a display element of the present invention.

FIG. 9 is a schematic structural view illustrating one example of the display element of the present invention.

As illustrated as one example in FIG. 9, the display element includes an organic electroluminescent (EL) element 350 and a drive circuit 320 configured to allow the organic EL element 350 to emit light. The drive circuit 320 is a current-driven basic circuit of 2Tr-1C, but the drive circuit 320 is not limited to the above-described circuit. Specifically, the display 310 is an organic EL display of a so-called active matrix system.

Figure 10:
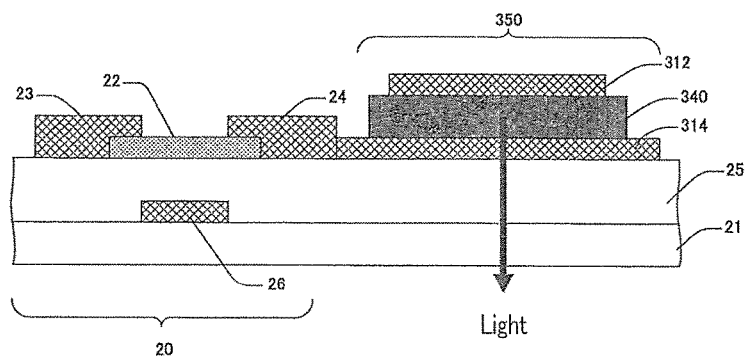
FIG. 10 is a schematic structural view illustrating one example of a positional relationship between an organic EL element and a field-effect transistor in a display element.

One example of a positional relationship between an organic EL element 350 and a field-effect transistor 20 serving as a drive circuit in a display element 302 is illustrated in FIG. 10. In FIG. 10, the organic EL element 350 is disposed next to the field-effect transistor 20. Note that, a field-effect transistor 10 and a capacitor (not illustrated) are also formed on the same base.

A passivation film is suitably disposed on or above the active layer 22, although the passivation film is not illustrated in FIG. 10. A material of the passivation film may be appropriately selected from $SiO_2$, SiON, SiNx, $Al_2O_3$, and fluoropolymers.

Figure 11:
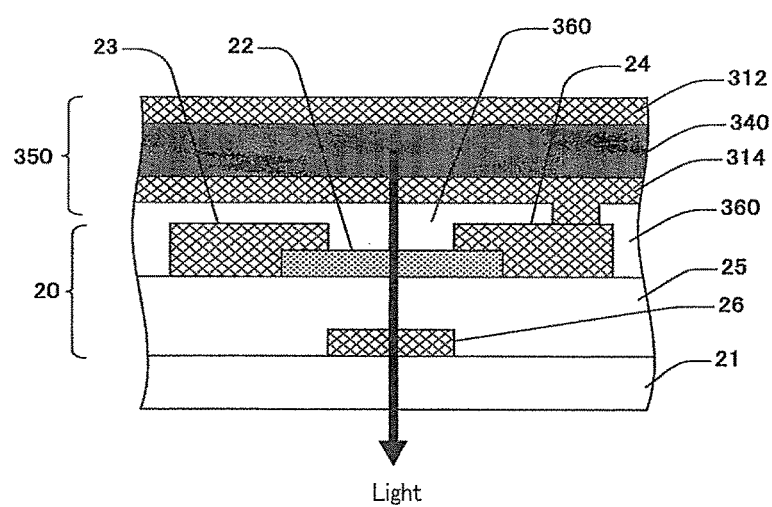
FIG. 11 is a schematic structural view illustrating another example of a positional relationship between an organic EL element and a field-effect transistor in a display element.

As illustrated in FIG. 11, for example, the organic EL element 350 may be disposed on the field-effect transistor 20. In the case of this structure, the gate electrode 26 is required to have transparency. Therefore, a conductive transparent oxide, such as ITO, $In_2O_3$, $SnO_2$, ZnO, Ga-added ZnO, Al-added ZnO, and Sb-added $SnO_2$, is used for the gate electrode 26. Note that, reference numeral 360 is an interlayer insulating film (a leveling film). Polyimide or acrylic resins can be used for the interlayer insulating film.

Figure 12:
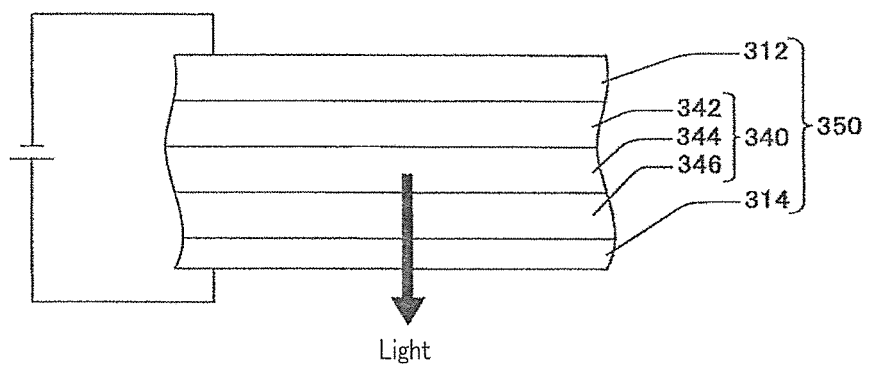
FIG. 12 is a schematic structural view illustrating one example of an organic EL element.

FIG. 12 is a schematic structural view illustrating one example of an organic EL element.

In FIG. 12, the organic EL element 350 includes a cathode 312, an anode 314, and an organic EL thin film layer 340.

A material of the cathode 312 is not particularly limited and may be appropriately selected depending on the intended purpose. Examples of the material include aluminium (Al), magnesium (Mg)-silver (Ag) alloy, aluminium (Al)-lithium (Li) alloy, and indium tin oxide (ITO). Note that, the magnesium (Mg)-silver (Ag) alloy becomes a high-reflective electrode if having a sufficient thickness, and an extremely thin film (less than about 20 nm) of the Mg—Ag alloy becomes a semi-transparent electrode. In FIG. 12, light is taken out from the side of the anode, but light can be taken out from the side of the cathode by making the cathode as a transparent or semi-transparent electrode.

A material of the anode 314 is not particularly limited and may be appropriately selected depending on the intended purpose. Examples of the material include indium tin oxide (ITO), indium zinc oxide (IZO), and silver (Ag)-neodymium (Nd) alloy. Note that, in a case where a silver alloy is used, the resultant electrode becomes a high-reflective electrode, which is suitable for taking light out from the side of the cathode.

The organic EL thin film layer 340 includes an electron transporting layer 342, a light emitting layer 344, and a hole transporting layer 346. The electron transporting layer 342 is coupled to a cathode 312 and the hole transporting layer 346 is coupled to an anode 314. The light emitting layer 344 emits light when a predetermined voltage is applied between the anode 314 and the cathode 312.

The electron transporting layer 342 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

The above-described organic EL element is a so-called "bottom emission" organic EL element, in which light is taken out from the side of the base. However, the organic EL element may be a "top emission" organic EL element, in which light is taken out from the opposite side to the base.

The driving circuit 320 in FIG. 9 will be described.

The drive circuit 320 includes two field-effect transistors 10 and 20 and a capacitor 30.

The field-effect transistor 10 operates as a switching element. A gate electrode G of the field-effect transistor 10 is coupled to a predetermined scanning line and a source electrode S of the field-effect transistor 10 is coupled to a predetermined data line. Moreover, a drain electrode D of the field-effect transistor 10 is coupled to one terminal of the capacitor 30.

The field-effect transistor 20 is configured to supply electric current to the organic EL element 350. The gate electrode G of the field-effect transistor 20 is coupled to the drain electrode D of the field-effect transistor 10. The drain electrode of the field-effect transistor 20 is coupled to the anode 314 of the organic EL element 350 and a source electrode S of the field-effect transistor 20 is coupled to a predetermined current supply line.

The capacitor 30 is configured to memorize the state of the field-effect transistor 10; i.e., data. The other terminal of the capacitor 30 is coupled to a predetermined current supply line.

When the field-effect transistor 10 turns into the state of "On", image data are stored in the capacitor 30 via the signal line Y2. Even after turning the field-effect transistor 10 into the state of "Off", the organic EL element 350 is driven by maintaining the "On" state of the field-effect transistor 20 corresponding to the image data.

Figure 13:
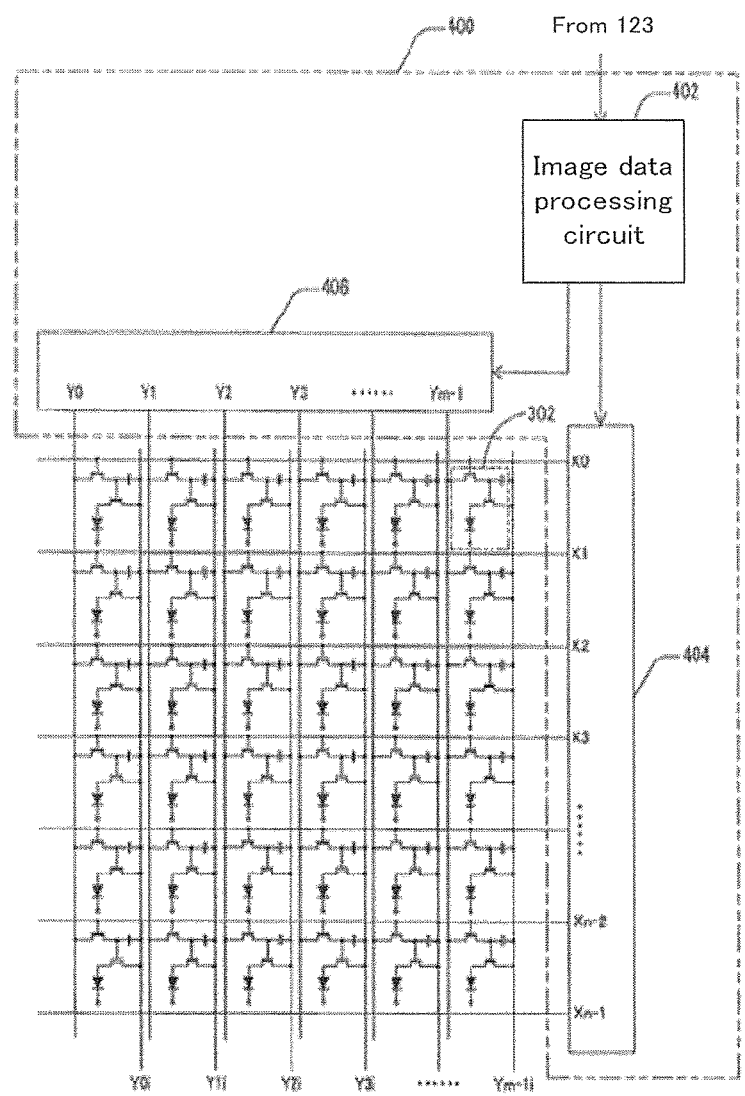
FIG. 13 is a diagram for presenting a display control device.

FIG. 13 is a schematic structural view illustrating another example of the image display device of the present invention.

In FIG. 13, the image display device includes display elements 302, wired lines (including scanning lines, data lines, and current supply lines), and a display control device 400.

The display control device 400 includes an image-data-processing circuit 402, a scanning-line-driving circuit 404, and a data-line-driving circuit 406.

The image-data-processing circuit 402 determines brightness of a plurality of display elements 302 in the display based on output signals of an image output circuit 123.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

The above embodiment refers to a case where the light control element is an organic EL element, but is not limitative. For example, the light control element may be an electrochromic element. In this case, the display is an electrochromic display.

Figure 14:
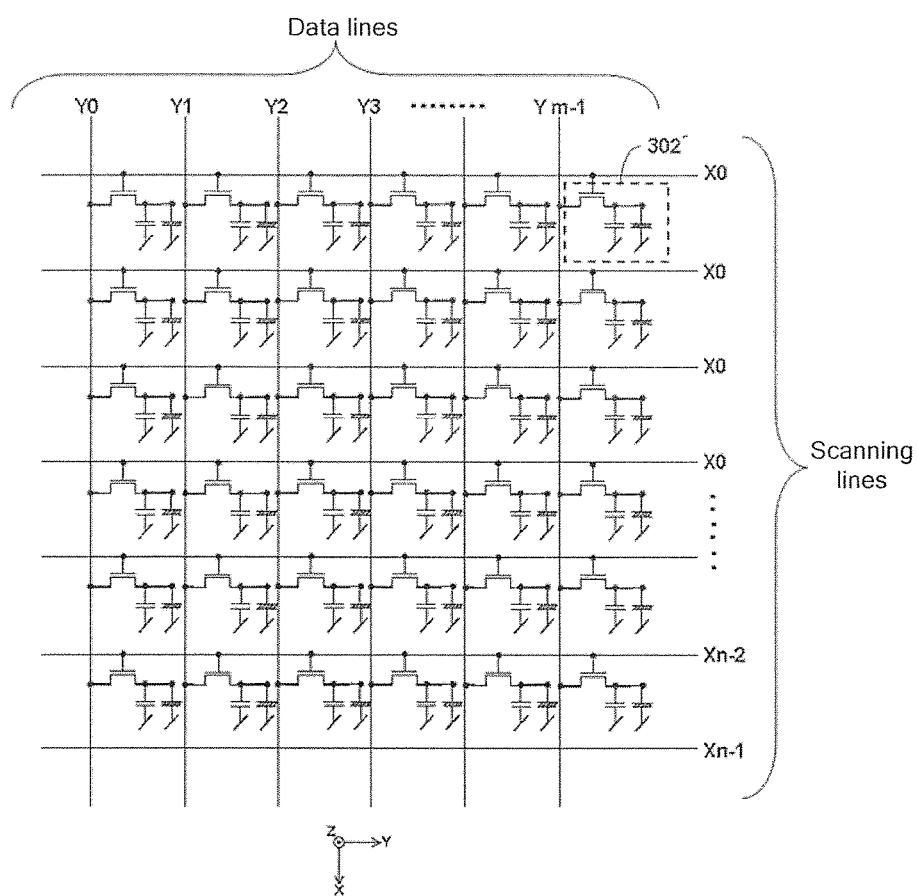
FIG. 14 is a diagram for presenting a liquid crystal display.
Figure 15:
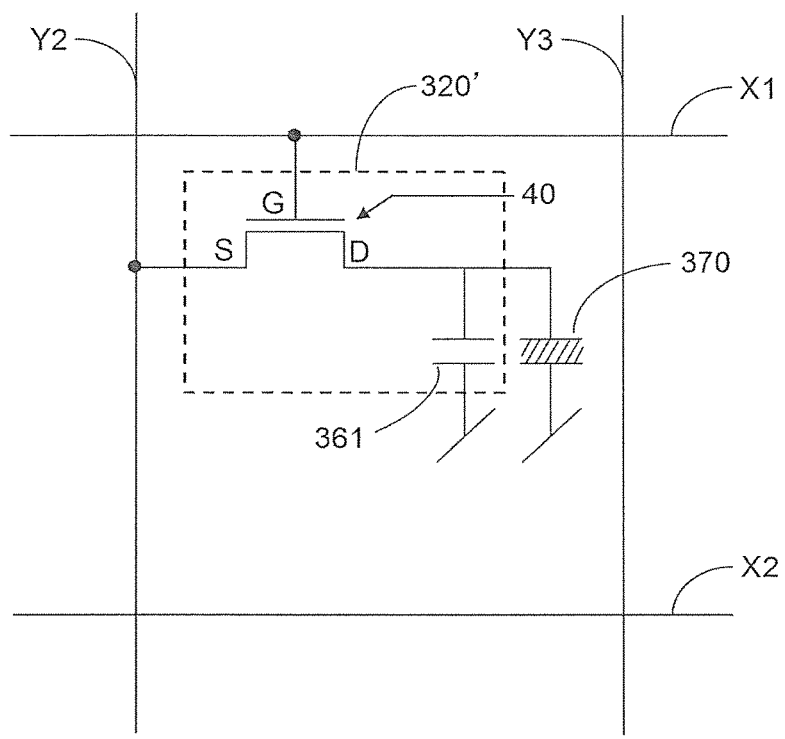
FIG. 15 is a diagram for presenting a display element in FIG. 14.

The light control element may be a liquid crystal element. In this case, the display is a liquid crystal display. As illustrated in FIG. 14, it is not necessary to provide a current supply line for a display element 302. As illustrated in FIG. 15, the drive circuit 320' may be produced with one field-effect transistor 40, which is similar to each of the field-effect transistors 10 and 20. In the field-effect transistor 40, a gate electrode G is coupled to a predetermined scanning line and a source electrode S is coupled to a predetermined data line. Moreover, a drain electrode D is coupled to a capacitor 361 and a pixel electrode of a liquid crystal element 370.

The light control element may be an electrophoretic element, an inorganic EL element, or an electrowetting element.

Although a case where the system of the present invention is a television device has been described above, the system of the present invention is not limited to the television device. The system is not particularly limited so long as the system includes the image display device 124 as a device for displaying images and information. For example, the system may be a computer system in which a computer (including a personal computer) is coupled to the image display device 124.

The image display device 124 can be used as a display unit in mobile information devices (e.g., mobile phones, portable music players, portable video players, electronic books, personal digital assistants (PDAs)) and camera devices (e.g., still cameras and video cameras). The image display device 124 can also be used for display units for various information in transportation systems (e.g., cars, aircraft, trains, and ships). Furthermore, the image display device 124 can be used for display units for various information in measuring devices, analysis devices, medical equipment, and advertising media.

EXAMPLES

The present invention will next be described by way of Examples, but the Examples should not be construed to limit the present invention in any way.

Example 1

<Production of Field-Effect Transistor>
—Formation of Gate Electrode—

Al was vapor-deposited on a glass substrate so as to have a thickness of 100 nm and the resultant Al film was subjected to patterning into lines by photolithography to form a gate electrode.

—Formation of Gate Insulating Layer—

Next, a film of SiON having a thickness of 200 nm was formed through plasma CVD using $SiH_4$ gas and $N_2O$ gas as raw materials at a temperature of 200° C. The resultant film was used as a gate insulating layer.

—Formation of Active Layer—

A film of $MgIn_2O_4$ doped with W was formed on the gate insulating layer through RF magnetron sputtering so as to have a film thickness of 50 nm. The target used was a polycrystalline sintered body having a composition of $MgIn_{1.99}W_{0.01}O_4$. Argon gas and oxygen gas were introduced as sputtering gas. The total pressure was fixed to 1.1 Pa and the oxygen concentration was set to 20% by volume. Patterning was performed through film formation via a metal mask. In the obtained active layer, W was introduced through substitutional doping at a concentration of 0.5 mol % relative to In in the $MgIn_2O_4$. Subsequently, annealing was performed in the atmosphere at 350° C. for 1 hour using an oven. The annealing is a treatment typically performed for the purpose of reducing level density of interfacial defects between an active layer and a gate insulating film to improve transistor characteristics.

—Formation of Source Electrode and Drain Electrode—

A source electrode and a drain electrode each having a thickness of 100 nm were formed on the gate insulating layer and the active layer through vacuum vapor deposition. The vapor deposition source used was Au. Patterning was performed through film formation via a metal mask so as to have a channel width of 400 μm and a channel length of 50 μm.

A top contact/bottom gate field-effect transistor similar to the field-effect transistor illustrated in FIG. 1 was obtained by the process described above.

<Evaluation of Transistor Performances>

Figure 16:
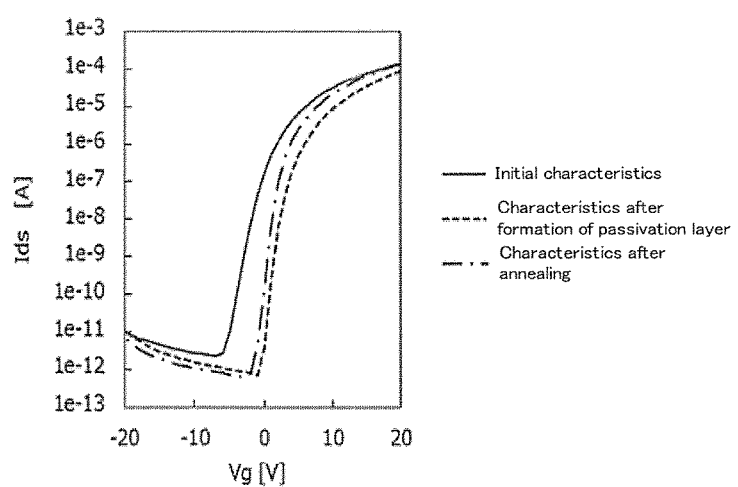
FIG. 16 is a graph presenting transfer characteristics (Vg-Ids characteristics) of a field-effect transistor of Example 1.

The obtained field-effect transistor was evaluated for transistor performances using a semiconductor parameter analyzer (semiconductor parameter analyzer 4156C, available from Agilent Technologies). Electric current (Ids) between the source electrode and the drain electrode was measured with voltage (Vds) between the source electrode and the drain electrode being 20 V and with varying gate voltage (Vg) from −20 V through +20 V to evaluate transfer characteristics (Vg-Ids characteristics). The obtained results are presented in FIG. 16. Subsequently, electric current (Ids) between the source electrode and the drain electrode was measured with varying the voltage (Vds) between the source electrode and the drain electrode from 10 V through 0 V to evaluate output characteristics (Vds-Ids characteristics). Vg was set to 10.0 V, 7.5 V, 5.0 V, 2.5 V, and 0 V. The obtained results are presented in FIG. 17.

Field-effect mobility (μ) and threshold voltage (Vth) in the saturated region were calculated using the measurement results of the transfer characteristics. Moreover, an on/off ratio of Ids was calculated. In the calculation of the on/off ratio, the Ids in the "on" state was a value when the Vg was 20 V and the Ids in the "off" state was a value when the Vg was −20 V. The results are presented in Table 1.

In FIGS. 16 to 26, "e" denotes the exponent of 10. Specifically, "1e-3" denotes "$1.0 \times 10^{-3}$" and "1e-10" denotes "$1.0 \times 10^{-10}$".

<Formation of Passivation Layer>

A film of SiON was formed in a region covering the active layer of the field-effect transistor through plasma CVD at a temperature of 200° C. using $SiH_4$ gas and $N_2O$ gas as raw materials so as to have a thickness of 200 nm. The SiON layer played a role of a passivation layer to prevent the active layer from being directly exposed to oxygen or moisture in the atmosphere. The transistor performances were evaluated before and after formation of the passivation layer in the same manner as described above to confirm whether the characteristics of the field-effect transistor suitable for practical use were maintained. A graph of the transfer characteristics is presented in FIG. 16. A graph of the output characteristics is presented in FIG. 18. The values of the field-effect mobility, the threshold voltage, and the on/off ratio are presented in Table 1.

<Heating Treatment>

The transistor after formation of the passivation layer was subjected to a heating treatment at 300° C. for 1 hour in the atmosphere. Thereafter, the transistor performances were evaluated in the above-described manner to confirm durability of the transistor to the heating treatment in a post process. A graph of the transfer characteristics is presented in FIG. 16. A graph of the output characteristics is presented in FIG. 19. The values of the field-effect mobility, the threshold voltage, and the on/off ratio are presented in Table 1.

<Production of Hall-Effect Measuring Element and Evaluation>

In order to estimate a carrier density of the oxide semiconductor used in the active layer of the transistor, Hall-effect measurement was performed on an oxide semiconductor film formed under the same conditions.

—Formation of n-Type Oxide Semiconductor—

An n-type oxide semiconductor film in a shape of a square having a side of 8 mm was patternwise formed on a glass substrate using a shadow mask under the same conditions as in the formation of the active layer of the above-described field-effect transistor.

—Formation of Contact Electrodes—

Contact electrodes for measuring Hall effect were formed at four corners on the n-type oxide semiconductor film through vacuum vapor deposition using a shadow mask. Al was used as a source of the vapor deposition.

—Evaluation of Electron Carrier Density—

The obtained Hall-effect measuring element was measured for specific resistance and Hall effect with a Hall-effect measuring system (ResiTest8300, available from TOYO Corporation) to determine electron carrier density ($cm^{-3}$) of the n-type oxide semiconductor film. The result was $1.4 \times 10^{18}/cm^3$.

In the field-effect transistor of Example 1, the W-doped $In_2MgO_4$ film was used as the active layer. W was introduced through substitutional doping at a concentration of 0.5 mol % relative to In, and electrons serving as carriers were generated by the difference between a valence of In (+trivalent) and a valence of W (+hexavalent). When the active layer was formed through sputtering, a relatively large amount of oxygen; i.e., 20% by volume was introduced into the chamber. The introduction of the oxygen prevented generation of oxygen defects in the active layer. The substitutional doping efficiently worked in the $In_2MgO_4$ film having a relatively robust spinel structure and as a result the carrier density in the active layer was $1.4 \times 10^{18}/cm^3$.

In Example 1, the characteristics of the active layer were stable because carriers were mainly generated by substitutional doping. Moreover, the source and drain electrodes in the field-effect transistor of Example 1 were formed of Au and thus had high durability. As a result, the transfer characteristics of the field-effect transistor after the process for forming the passivation layer were excellent and suitable for practical use. That is, high field-effect mobility and high on/off ratio were exhibited and Ids rose sufficiently rapidly at Vg of around 0 V. Moreover, the excellent characteristics were maintained because the electrodes were not oxidized or the carrier density of the active layer did not largely change even after heating at 300° C.

Figure 17:
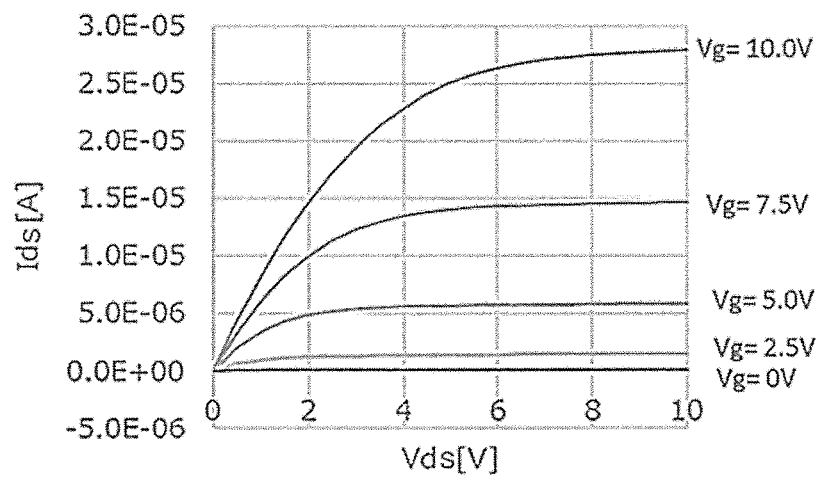
FIG. 17 is a graph presenting output characteristics (Vds-Ids characteristics) of a field-effect transistor of Example 1 (before formation of a passivation layer)
Figure 18:
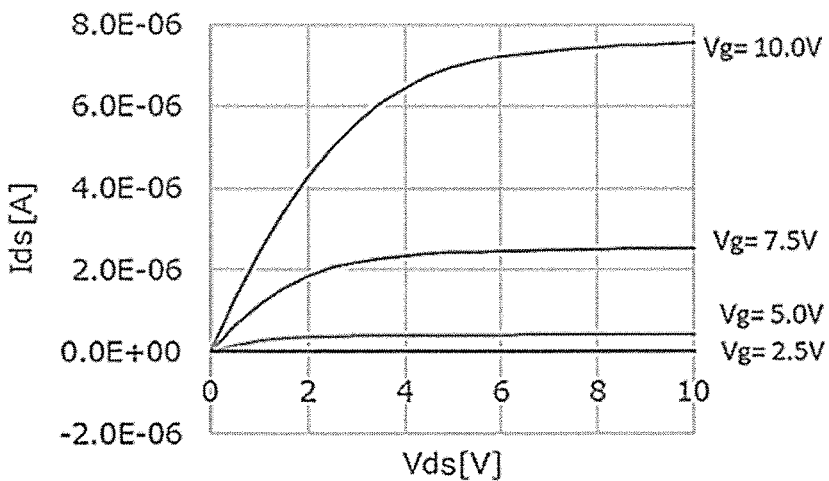
FIG. 18 is a graph presenting output characteristics (Vds-Ids characteristics) of a field-effect transistor of Example 1 (after formation of the passivation layer)
Figure 19:
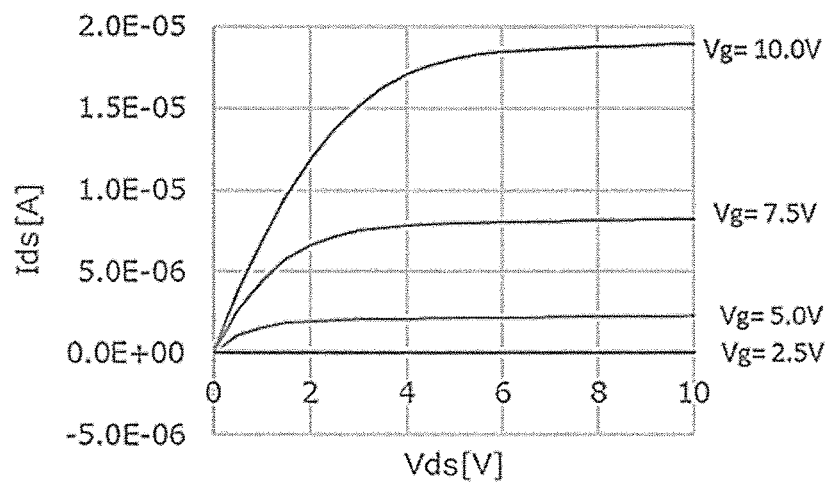
FIG. 19 is a graph presenting output characteristics (Vds-Ids characteristics) of a field-effect transistor of Example 1 (after annealing)
Figure 20:
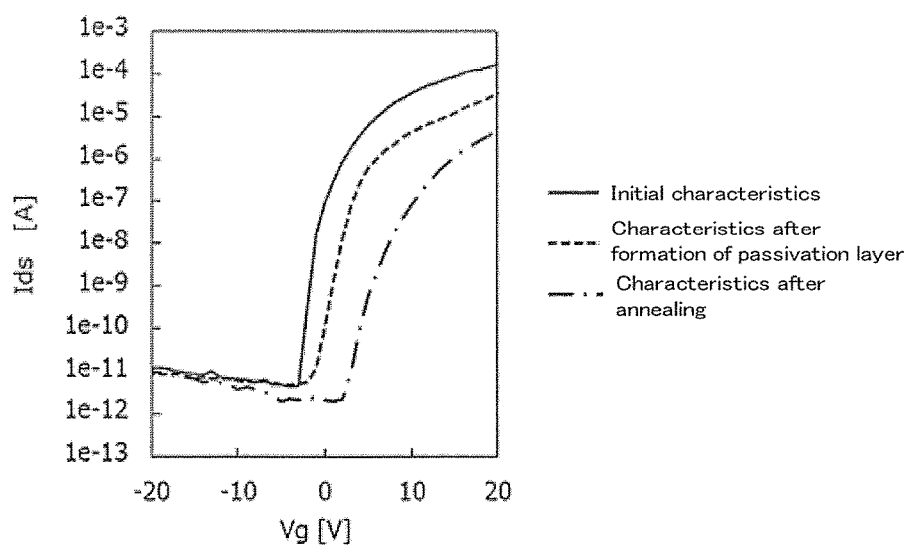
FIG. 20 is a graph presenting transfer characteristics (Vg-Ids characteristics) of a field-effect transistor of Comparative Example 1.

It was observed from the output characteristics presented in FIGS. 17, 18 and 19 that there was a linear correlation between Vds and Ids around Vds~0V in any of the graphs of FIGS. 17, 18, and 19. Specifically, the ohmic contacts were formed between the source electrode and the active layer and between the drain electrode and the active layer in the initial state of characteristics, and the excellent state of the ohmic contacts was maintained even after formation of the passivation film and after heating.

TABLE 1

|  | Field-effect mobility μ [cm²/Vs] | Threshold voltage Vth [V] | On/off ratio |
| --- | --- | --- | --- |
| Initial characteristics | 4.67 | −0.66 | $1.30 \times 10^7$ |
| Characteristics after formation of passivation layer | 7.19 | 6.79 | $7.91 \times 10^6$ |
| Characteristics after heating | 7.89 | 4.05 | $1.93 \times 10^6$ |

Comparative Example 1

A transistor was produced and evaluated for performances in the same manner as in Example 1, except that the formation method of the active layer was changed as described below. A graph of the transfer characteristics is presented in FIG. 20. The values of the field-effect mobility, the threshold voltage, and the on/off ratio are presented in Table 2. Moreover, output characteristics after the heating subsequent to formation of the passivation layer are presented in FIG. 21.

A Hall-measuring element was produced in the same manner as in Example 1 using a n-type oxide semiconductor film formed in the same manner as the method described below to measure an electron carrier density. The result was $1.1 \times 10^{18}/cm^3$.

—Formation of Active Layer—

A film of $MgIn_2O_4$ was formed on the gate insulating layer through RF magnetron sputtering so as to have a film thickness of 50 nm. The target used was a polycrystalline sintered body having a composition of $MgInO_4$. Argon gas and oxygen gas were introduced as sputtering gas. The total pressure was fixed to 1.1 Pa and the oxygen concentration was set to 0.8% by volume. Patterning was performed through film formation via a metal mask.

The field-effect transistor of Comparative Example 1 used an $In_2MgO_4$ film having undergone no doping as the active layer. Carriers having a density of $1.1 \times 10^{18}/cm^3$ were generated by oxygen defects, by setting a low value as the oxygen concentration in the atmosphere for forming the active layer through sputtering; i.e., 0.8% by volume. The source and drain electrodes were formed of Au and thus had high durability.

Figure 21:
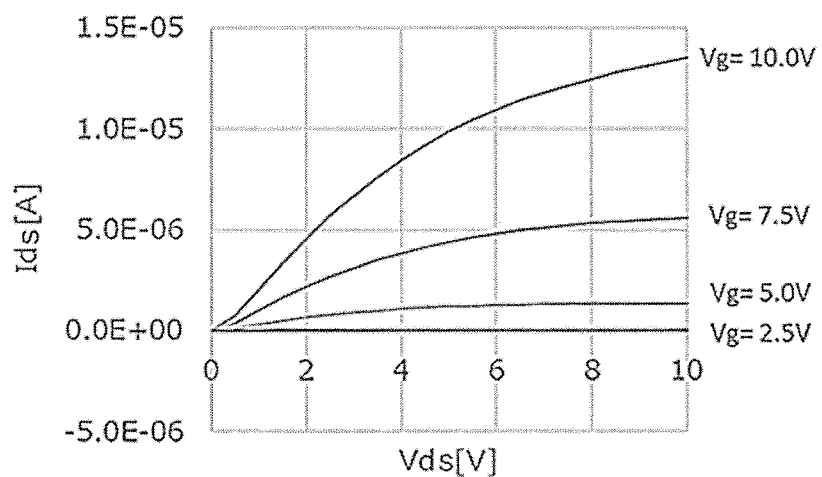
FIG. 21 is a graph presenting output characteristics (Vds-Ids characteristics) of a field-effect transistor of Comparative Example 1 (after annealing)
Figure 22:
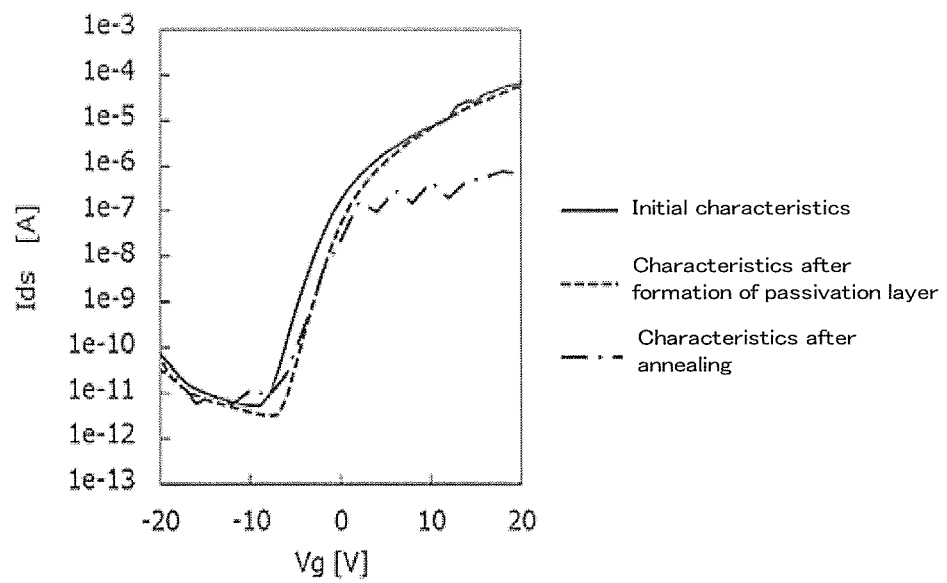
FIG. 22 is a graph presenting transfer characteristics (Vg-Ids characteristics) of a field-effect transistor of Comparative Example 2.

The initial characteristics of the transistor were excellent considering that the field-effect mobility obtained was 5 $cm^2/Vs$ or greater and the on/off ratio obtained was $10^7$ or greater. However, deteriorations in the characteristics, such as reduction in the field-effect mobility and a slow rise of the transfer characteristics, were observed after the process for forming the passivation layer. After the annealing at 300° C., a shift of the transfer curve to positive direction and a significant reduction in the "on" current were observed, and the field-effect mobility became 1 $cm^2/Vs$ or less; i.e., below the practical level. The above deteriorations in the characteristics occurred because oxygen in SiON; i.e., the passivation layer, was diffused in the active layer to reduce an amount of the oxygen defects in the active layer to increase the resistance, and along with the increase in the resistance, the electrical contact between the source and drain electrodes of Au and the active layer became poor. It was found from FIG. 21 presenting the output characteristics after the heating that the increase of Ids became milder as Ids was closer to the starting point, and the contacts between the source and drain electrodes and the active layer were not ohmic contacts. Here, the change in the oxygen content, having occurred because the carriers in the active layer were generated by the oxygen defects, greatly influenced the transistor characteristics, causing instability of the transistor characteristics.

TABLE 2

|  | Field-effect mobility μ [$cm^2/Vs$] | Threshold voltage Vth [V] | On/off ratio |
| --- | --- | --- | --- |
| Initial characteristics | 5.82 | −0.04 | $1.28 \times 10^7$ |
| Characteristics after formation of passivation layer | 3.77 | 8.76 | $3.83 \times 10^6$ |
| Characteristics after heating | 0.79 | 10.95 | $4.30 \times 10^5$ |

Comparative Example 2

A transistor was produced and evaluated for performances in the same manner as in Example 1, except that the formation method of the source electrode and the drain electrode was changed as described below. A graph of the transfer characteristics is presented in FIG. 22. The values of the field-effect mobility, the threshold voltage, and the on/off ratio are presented in Table 3. Moreover, the output characteristics of the transistor after the heating subsequent to formation of the passivation layer are presented in FIG. 23.

—Formation of Source Electrode and Drain Electrode—

A source electrode and a drain electrode each having a thickness of 100 nm were formed on the gate insulating layer and the active layer by vacuum vapor deposition. The vapor deposition source used was Al. Patterning was performed through film formation via a metal mask so as to have a channel width of 400 μm and a channel length of 50 μm.

In the field-effect transistor of Comparative Example 2, an oxide semiconductor identical to the oxide semiconductor of Example 1 was used for the active layer, and carriers were mainly generated by substitutional doping. Therefore, the characteristics of the active layer were stable. The source and drain electrodes were formed of Al and were therefore easily oxidized.

The initial characteristics of the transistor had a strong tendency of depletion where carriers were somewhat more, but the initial characteristics hardly changed even after the process for forming the passivation layer. After the process of the heating at 300° C., however, Ids stopped increasing even when Vg was increased, and the transfer characteristics significantly deteriorated. It was considered that the deterioration occurred because Al of the source and drain electrodes was oxidized at the time of heating to have increased resistance. Specifically, in the transistor of Comparative Example 2, the electrode material was deteriorated through oxidization even though the characteristics of the active layer were stable. Therefore, durability to the heat treatment could not be ensured. It was also observed from the output characteristics after the heating process (FIG. 23) that the transistor could not operate normally.

TABLE 3

|  | Field-effect mobility μ [$cm^2/Vs$] | Threshold voltage Vth [V] | On/off ratio |
| --- | --- | --- | --- |
| Initial characteristics | 4.81 | 5.7 | $8.99 \times 10^5$ |
| Characteristics after formation of passivation layer | 4.99 | 7.27 | $8.68 \times 10^5$ |
| Characteristics after heating | Unable to be evaluated | Unable to be evaluated | $2.00 \times 10^4$ |

Examples 2 to 5

Transistors were produced in the same manner as in Example 1, except that the formation method of the active layer was changed as described below.

—Formation of Active Layer—

An active layer having a film thickness of 50 nm was formed on the gate insulating layer by RF magnetron sputtering. The target used was a polycrystalline sintered body having a composition presented in Table 4. Argon gas and oxygen gas were introduced as sputtering gas to fix the total pressure of 1.1 Pa and the oxygen concentration of a value presented in Table 4. Patterning was performed through film formation via a metal mask.

In the active layer of Example 2, Al (+trivalent) was introduced through substitutional doping at a concentration of 5 mol % relative to Zn (+divalent) in ZnO.

In the active layer of Example 3, Nb (+pentavalent) was introduced through substitutional doping at a concentration of 1 mol % relative to Ti (+tetravalent) in $TiO_2$.

In the active layer of Example 4, Sb (+pentavalent) was introduced through substitutional doping at a concentration of 2 mol % relative to Sn (+tetravalent) in $SnO_2$.

In the active layer of Example 5, Zn (+divalent) was introduced through substitutional doping at a concentration of 5 mol % relative to Cu (+monovalent) in $Cu_2WO_4$.

Subsequently, annealing was performed for 1 hour in the atmosphere using an oven. The set temperatures are presented in Table 4.

TABLE 4

|  | Composition of target | Oxygen concentration during sputtering | Annealing temperature |
|---|---|---|---|
| Ex. 2 | $Zn_{0.95}Al_{0.05}O$ | 20% | 300° C. |
| Ex. 3 | $Ti_{0.99}Nb_{0.01}O_2$ | 10% | 450° C. |
| Ex. 4 | $Sn_{0.98}Sb_{0.02}O_2$ | 20% | 300° C. |
| Ex. 5 | $Cu_{1.9}Zn_{0.1}WO_4$ | 20% | 300° C. |

Film formation of a passivation layer and heating at 300° C. were performed on each of the transistors in the same manner as in Example 1. Transfer characteristics were measured, and the obtained values of field-effect mobility, threshold voltage, and on/off ratio are presented in Tables 5 to 7. In any of Examples 2 to 5, a normal operation of the transistor could be confirmed even after formation of the passivation layer and the heating, indicating high post-process durability. Moreover, output characteristics were measured at an initial stage, after formation of the passivation layer, and after the heating. As a result, a linear correlation between Vds and Ids was observed around Vds~0V at any of the timings. Specifically, it could be confirmed that ohmic contacts were formed between the source electrode and the active layer and between the drain electrode and the active layer.

TABLE 5

| Example 2 | Field-effect mobility μ [cm$^2$/Vs] | Threshold voltage Vth [V] | On/off ratio |
|---|---|---|---|
| Initial characteristics | 3.48 | 10.21 | 4.23 × 10$^6$ |
| Characteristics after formation of passivation layer | 4.18 | 8.85 | 6.10 × 10$^6$ |
| Characteristics after heating | 3.99 | 8.78 | 5.54 × 10$^6$ |

TABLE 6

| Example 3 | Field-effect mobility μ [cm$^2$/Vs] | Threshold voltage Vth [V] | On/off ratio |
|---|---|---|---|
| Initial characteristics | 0.12 | 6.33 | 9.84 × 10$^3$ |
| Characteristics after formation of passivation layer | 0.12 | 6.14 | 8.80 × 10$^3$ |
| Characteristics after heating | 0.13 | 5.45 | 1.21 × 10$^4$ |

TABLE 7

| Example 4 | Field-effect mobility μ [cm$^2$/Vs] | Threshold voltage Vth [V] | On/off ratio |
|---|---|---|---|
| Initial characteristics | 1.50 | 4.42 | 8.49 × 10$^5$ |
| Characteristics after formation of passivation layer | 1.86 | 4.11 | 9.10 × 10$^5$ |
| Characteristics after heating | 1.88 | 4.02 | 9.49 × 10$^5$ |

TABLE 8

| Example 5 | Field-effect mobility μ [cm$^2$/Vs] | Threshold voltage Vth [V] | On/off ratio |
|---|---|---|---|
| Initial characteristics | 0.21 | 8.76 | 4.58 × 10$^4$ |
| Characteristics after formation of passivation layer | 0.18 | 9.25 | 3.97 × 10$^4$ |
| Characteristics after heating | 0.18 | 10.2 | 3.50 × 10$^4$ |

Example 6

A bottom gate/bottom contact field-effect transistor was produced in the same manner as in Example 1, except that the formation method of the active layer and the formation method of the source electrode and the drain electrode were changed as described below, and the order of the formation process of the active layer and the formation process of the source electrode and the drain electrode was reversed.

—Formation of Source Electrode and Drain Electrode—

A gold nanometal ink (available from ULVAC, Au-1Chb, average particle diameter: 5 nm, and metal content: 50% by mass) was applied onto the gate insulating layer in a predetermined pattern with an inkjet device. The applied solution was heated for 30 minutes at 300° C. in the atmosphere to form a source electrode and a drain electrode each having a thickness of 100 nm. In the formation of the source electrode and the drain electrode, a channel width was set to 400 μm and a channel length defined as a length between the source electrode and the drain electrode was set to 50 μm.

—Formation of Active Layer—

35.488 g of indium nitrate ($In(NO_3)_3 \cdot 3H_2O$) was weighed and then dissolved in 100 mL of ethylene glycol monomethyl ether to prepare Liquid A.

1.211 g of rhenium oxide ($Re_2O_7$) was weighed and then dissolved in 500 mL of ethylene glycol monomethyl ether to prepare Liquid B.

2.330 g of zirconium chloride ($ZrCl_4$) was weighed and then dissolved in 100 mL of ethylene glycol monomethyl ether to prepare Liquid C.

Liquid A (99.9 mL), Liquid B (20 mL), Liquid C (50 mL), ethylene glycol monomethyl ether (40.1 mL), and 1,2-propanediol (210 mL) were mixed and stirred at room temperature to prepare a coating liquid for producing a n-type oxide semiconductor.

Next, the coating liquid for producing a n-type oxide semiconductor was applied by inkjet printing onto a desired place in a region which was on the gate insulating layer and across the space between the source electrode and the drain electrode. The applied coating liquid was baked for 1 hour at 400° C. in the atmosphere to form an active layer. A ratio of elements (excluding oxygen) of the thus-obtained active layer was as follows: In:Re:Zr=99.9:0.1:5. Re (+heptavalent) was introduced through substitutional doping at a concentration of 0.1 mol % relative to In (+trivalent), thereby generating carriers. Zr was added for the purpose of suppressing generation of oxygen defects.

Subsequently, film formation of a passivation layer and heating at 300° C. were performed in the same manner as in Example 1. Transfer characteristics were measured, and the obtained values of the field-effect mobility, the threshold voltage, and the on/off ratio are presented in Table 10-1.

Example 7

A bottom gate/top contact field-effect transistor was produced in the same manner as in Example 1, except that the formation method of the active layer and the formation method of the source electrode and the drain electrode were changed as described below. Subsequently, film formation of a passivation layer and heating at 300° C. were performed in the same manner as in Example 1. Transfer characteristics of the field-effect transistor were evaluated in the same manner as in Example 1. The results are presented in Table 10-1.
—Formation Method of Active Layer—
An active layer was formed in the same manner as in Example 6.
—Formation of Source Electrode and Drain Electrode—
Pt resinate solution (available from DAIKEN CHEMICAL CO., LTD., organic platinum compound, and metal content: 10% by mass) was applied onto the formed active layer in a predetermined pattern with an inkjet device. The applied solution was heated for 60 minutes at 300° C. in the atmosphere to form a source electrode and a drain electrode each having a thickness of 100 nm. In the formation of the source electrode and the drain electrode, a channel width was set to 400 µm and a channel length defined as a length between the source electrode and the drain electrode was set to 50 µm.

Example 8

A bottom gate/top contact field-effect transistor was produced in the same manner as in Example 1, except that the formation method of the active layer and the formation method of the source electrode and the drain electrode were changed as described below. Subsequently, film formation of a passivation layer and heating at 300° C. were performed in the same manner as in Example 1. Transfer characteristics of the field-effect transistor were evaluated in the same manner as in Example 1. The results are presented in Table 10-1.
—Formation of Active Layer—
Liquid A including an indium compound and Liquid C including a zirconium compound were prepared in the same manner as in Example 6.

0.636 g of osmium oxide ($OsO_4$) was weighed and then dissolved in 500 mL of ethylene glycol monomethyl ether to prepare Liquid B.

Liquid A (99.9 mL), Liquid B (20 mL), Liquid C (50 mL), ethylene glycol monomethyl ether (40.1 mL), and 1,2-propanediol (210 mL) were mixed and stirred at room temperature to prepare a coating liquid for producing a n-type oxide semiconductor.

Subsequently, the coating liquid for producing a n-type oxide semiconductor was applied to a desired place on the gate insulating layer by inkjet printing. The applied coating liquid was baked for 1 hour at 400° C. in the atmosphere to form an active layer. A ratio of elements (excluding oxygen) of the thus-obtained active layer was as follows: In:Os:Zr=99.9:0.1:5. Os (+octavalent) was introduced through substitutional doping at a concentration of 0.1 mol % relative to In (+trivalent), thereby generating carriers. Zr was added for the purpose of suppressing generation of oxygen defects.
—Formation of Source Electrode and Drain Electrode—
Au resinate solution (available from DAIKEN CHEMICAL CO., LTD., organic gold compound, and metal content: 20% by mass) was applied onto the formed active layer in a predetermined pattern with an inkjet device. The applied solution was heated for 60 minutes at 400° C. in the atmosphere to form a source electrode and a drain electrode each having a thickness of 100 nm. In the formation of the source electrode and the drain electrode, a channel width was set to 400 µm and a channel length defined as a length between the source electrode and the drain electrode was set to 50 µm.

Example 9

A bottom gate/top contact field-effect transistor was produced in the same manner as in Example 8, except that the formation method of the active layer was changed as described below. Subsequently, film formation of a passivation layer and heating at 300° C. were performed in the same manner as in Example 1. Transfer characteristics of the field-effect transistor were evaluated in the same manner as in Example 1. The results are presented in Table 10-1.
—Formation of Active Layer—
35.488 g of indium nitrate ($In(NO_3)_3.3H_2O$) was weighed and then dissolved in 100 mL of ethylene glycol monomethyl ether to prepare Liquid A.

1.896 g of tin chloride ($SnCl_2$) was weighed and then dissolved in 100 mL of ethylene glycol monomethyl ether to prepare Liquid B.

3.999 g of gallium nitrate ($Ga(NO_3)_3.8H_2O$) was weighed and then dissolved in 100 mL of ethylene glycol monomethyl ether to prepare Liquid C.

Liquid A (99.6 mL), Liquid B (100 mL), Liquid C (4 mL), ethylene glycol monomethyl ether (6.4 mL), and 1,2-propanediol (210 mL) were mixed and stirred at room temperature to prepare a coating liquid for producing a n-type oxide semiconductor.

Subsequently, the coating liquid for producing a n-type oxide semiconductor was applied to a desired place on the gate insulating layer by inkjet printing. The applied coating liquid was baked for 1 hour at 400° C. in the atmosphere to form an active layer. A ratio of elements (excluding oxygen) of the thus-obtained active layer was as follows: In:Sn:Ga=99.6:0.4:10. Sn (+tetravalent) was introduced through substitutional doping at a concentration of 0.4 mol % relative to In (+trivalent), thereby generating carriers. Ga was added for the purpose of suppressing generation of oxygen defects.

Example 10

A bottom gate/top contact field-effect transistor was produced in the same manner as in Example 9, except that the formation method of the source electrode and the drain electrode was changed as described below. Subsequently, film formation of a passivation layer and heating at 300° C. were performed in the same manner as in Example 1. Transfer characteristics of the field-effect transistor were evaluated in the same manner as in Example 1. The results are presented in Table 10-1.
—Formation of Source Electrode and Drain Electrode—
Pd resinate solution (available from DAIKEN CHEMICAL CO., LTD., organic palladium compound, and metal content: 5% by mass) was applied onto the formed active layer in a predetermined pattern with an inkjet device. The applied solution was heated for 60 minutes at 300° C. in the atmosphere to form a source electrode and a drain electrode each having a thickness of 100 nm. In the formation of the source electrode and the drain electrode, a channel width was set to 400 μm and a channel length defined as a length between the source electrode and the drain electrode was set to 50 nm.

Example 11

A bottom gate/top contact field-effect transistor was produced in the same manner as in Example 8, except that the formation method of the active layer was changed as described below. Subsequently, film formation of a passivation layer and heating at 300° C. were performed in the same manner as in Example 1. Transfer characteristics of the field-effect transistor were evaluated in the same manner as in Example 1. The results are presented in Table 10-1.
—Formation of Active Layer—
35.488 g of indium nitrate ($In(NO_3)_3 \cdot 3H_2O$) was weighed and then dissolved in 100 mL of ethylene glycol monomethyl ether to prepare Liquid A.
18.961 g of tin chloride ($SnCl_2$) was weighed and then dissolved in 100 mL of ethylene glycol monomethyl ether to prepare Liquid B.
3.282 g of molybdenum(VI) dioxide bis(acetylacetonate) was weighed and then dissolved in 89.317 mL of ethylene glycol monomethyl ether to prepare Liquid C.
1.068 mL of 1,1,1,3,3,3-hexamethyldisilazane (HMDS) was weighed and then dissolved in 98.932 mL of ethylene glycol monomethyl ether to prepare Liquid D.
Liquid A (49.9 mL), Liquid B (50.0 mL), Liquid C (1.0 mL), Liquid D (50.0 mL), ethylene glycol monomethyl ether (49.1 mL), and 1,2-propanediol (210 mL) were mixed and stirred at room temperature to prepare a coating liquid for producing a n-type oxide semiconductor.
Subsequently, the coating liquid for producing a n-type oxide semiconductor was applied to a desired place on the gate insulating layer by inkjet printing. The applied coating liquid was baked for 1 hour at 400° C. in the atmosphere to form an active layer. A ratio of elements (excluding oxygen) of the thus-obtained active layer was as follows: In:Sn:Mo:Si=49.9:50:0.1:5. Mo (+hexavalent) was introduced through substitutional doping at a concentration of 0.2 mol % relative to In (+trivalent) in $In_2Sn_2O_7$, thereby generating carriers. Si was added for the purpose of suppressing generation of oxygen defects.

Examples 12 to 19

Bottom gate/top contact field-effect transistors were produced in the same manner as in Example 8, except that the formation method of the active layer was changed as described below. Subsequently, film formation of a passivation layer and heating at 300° C. were performed in the same manner as in Example 1. Transfer characteristics were evaluated in the same manner as in Example 1. The results are presented in Table 10-2.
—Formation of Active Layer—
35.488 g of indium nitrate ($In(NO_3)_3 \cdot 3H_2O$) was weighed and then dissolved in 100 mL of ethylene glycol monomethyl ether to prepare Liquid A.
14.874 g of zinc nitrate ($Zn(NO_3)_2 \cdot 6H_2O$) was weighed and then dissolved in 100 mL of ethylene glycol monomethyl ether to prepare Liquid B.

3.965 g of tungsten chloride ($WCl_6$) was weighed and then dissolved in 100 mL of ethylene glycol monomethyl ether to prepare Liquid C.
In each Example, a compound including element A was weighed as presented in Table 9 and was dissolved in 100 mL of ethylene glycol monomethyl ether to prepare Liquid D of each Example. However, only in Example 15, Liquid D was prepared using ethylene glycol instead of ethylene glycol monomethyl ether in view of solubility.
Liquid A (49.9 mL), Liquid B (50.0 mL), Liquid C (1.0 mL), Liquid D (37.5 mL), ethylene glycol monomethyl ether (71.6 mL), and 1,2-propanediol (210 mL) were mixed and stirred at room temperature to prepare a coating liquid for producing a n-type oxide semiconductor.
Subsequently, the coating liquid for producing a n-type oxide semiconductor was applied to a desired place on the gate insulating layer by inkjet printing. The applied coating liquid was baked for 1 hour at 400° C. in the atmosphere to form an active layer. A ratio of elements (excluding oxygen) of the thus-obtained active layer was as follows: In:Zn:W:A=1.996:1:0.004:0.15. W (+hexavalent) was introduced through substitutional doping at a concentration of 0.2 mol % relative to In (+trivalent) in $In_2ZnO_3$, thereby generating carriers. The element A was added for the purpose of suppressing generation of oxygen defects.

TABLE 9

| | Element A | Compound including element A | Amount to be weighed [g] |
|---|---|---|---|
| Ex. 12 | La | Lanthanum nitrate ($La(NO_3)_3 \cdot 6H_2O$) | 4.330 |
| Ex. 13 | Ca | Calcium nitrate ($Ca(NO_3)_2 \cdot 4H_2O$) | 2.362 |
| Ex. 14 | Sr | Strontium chloride ($SrCl_2 \cdot 6H_2O$) | 2.666 |
| Ex. 15 | Ba | Barium chloride ($BaCl_2 \cdot 2H_2O$) | 2.443 |
| Ex. 16 | Ge | Germanium oxide ($GeO_2$) | 1.046 |
| Ex. 17 | Hf | Hafnium chloride ($HfCl_4$) | 3.203 |
| Ex. 18 | Sc | Scandium nitrate ($Sc(NO_3)_3 \cdot 5H_2O$) | 3.211 |
| Ex. 19 | Y | Yttrium nitrate ($Y(NO_3)_3 \cdot 6H_2O$) | 3.829 |

TABLE 10-1

| | | Field-effect mobility μ [cm$^2$/Vs] | Threshold voltage Vth [V] | On/off ratio |
|---|---|---|---|---|
| Ex. 6 | Initial characteristics | 2.83 | 6.47 | $1.35 \times 10^7$ |
| | Characteristics after formation of passivation layer | 2.50 | 6.27 | $1.21 \times 10^7$ |
| | Characteristics after heating | 2.25 | 8.46 | $1.00 \times 10^7$ |
| Ex. 7 | Initial characteristics | 2.11 | 6.85 | $2.31 \times 10^7$ |
| | Characteristics after formation of passivation layer | 2.12 | 6.79 | $2.19 \times 10^7$ |
| | Characteristics after heating | 2.52 | 6.87 | $2.10 \times 10^7$ |
| Ex. 8 | Initial characteristics | 5.59 | 6.02 | $4.21 \times 10^7$ |
| | Characteristics after formation of passivation layer | 4.95 | 7.50 | $2.22 \times 10^7$ |
| | Characteristics after heating | 6.10 | 6.25 | $4.25 \times 10^7$ |

TABLE 10-1-continued

|  |  | Field-effect mobility μ [cm²/Vs] | Threshold voltage Vth [V] | On/off ratio |
|---|---|---|---|---|
| Ex. 9 | Initial characteristics | 8.82 | 7.50 | $2.31 \times 10^7$ |
|  | Characteristics after formation of passivation layer | 8.84 | 7.55 | $2.21 \times 10^7$ |
|  | Characteristics after heating | 8.81 | 7.49 | $3.18 \times 10^7$ |
| Ex. 10 | Initial characteristics | 1.52 | 5.74 | $2.54 \times 10^7$ |
|  | Characteristics after formation of passivation layer | 1.46 | 5.42 | $1.89 \times 10^7$ |
|  | Characteristics after heating | 1.40 | 4.19 | $2.40 \times 10^7$ |
| Ex. 11 | Initial characteristics | 0.56 | 4.21 | $8.79 \times 10^6$ |
|  | Characteristics after formation of passivation layer | 0.61 | 3.90 | $9.10 \times 10^6$ |
|  | Characteristics after heating | 0.58 | 6.24 | $7.14 \times 10^6$ |

TABLE 10-2

|  |  | Field-effect mobility μ [cm²/Vs] | Threshold voltage Vth [V] | On/off ratio |
|---|---|---|---|---|
| Ex. 12 | Initial characteristics | 8.26 | 4.95 | $7.54 \times 10^7$ |
|  | Characteristics after formation of passivation layer | 8.31 | 4.84 | $8.10 \times 10^7$ |
|  | Characteristics after heating | 8.44 | 4.98 | $8.95 \times 10^7$ |
| Ex. 13 | Initial characteristics | 7.86 | 4.54 | $5.96 \times 10^7$ |
|  | Characteristics after formation of passivation layer | 7.58 | 4.72 | $6.54 \times 10^7$ |
|  | Characteristics after heating | 7.61 | 4.73 | $6.24 \times 10^7$ |
| Ex. 14 | Initial characteristics | 8.87 | 5.02 | $8.97 \times 10^7$ |
|  | Characteristics after formation of passivation layer | 8.91 | 4.99 | $7.98 \times 10^7$ |
|  | Characteristics after heating | 8.73 | 5.10 | $8.57 \times 10^7$ |
| Ex. 15 | Initial characteristics | 5.12 | 4.88 | $5.89 \times 10^7$ |
|  | Characteristics after formation of passivation layer | 5.11 | 5.02 | $5.11 \times 10^7$ |
|  | Characteristics after heating | 5.53 | 4.71 | $5.46 \times 10^7$ |
| Ex. 16 | Initial characteristics | 4.21 | 2.54 | $5.10 \times 10^7$ |
|  | Characteristics after formation of passivation layer | 4.04 | 3.11 | $4.12 \times 10^7$ |
|  | Characteristics after heating | 4.10 | 3.07 | $4.35 \times 10^7$ |
| Ex. 17 | Initial characteristics | 3.29 | 3.10 | $3.87 \times 10^7$ |
|  | Characteristics after formation of passivation layer | 3.98 | 3.40 | $4.08 \times 10^7$ |
|  | Characteristics after heating | 3.68 | 3.18 | $4.14 \times 10^7$ |
| Ex. 18 | Initial characteristics | 4.54 | 4.24 | $5.18 \times 10^7$ |
|  | Characteristics after formation of passivation layer | 4.39 | 4.68 | $5.68 \times 10^7$ |
|  | Characteristics after heating | 4.10 | 4.53 | $5.00 \times 10^7$ |

TABLE 10-2-continued

|  |  | Field-effect mobility μ [cm²/Vs] | Threshold voltage Vth [V] | On/off ratio |
|---|---|---|---|---|
| Ex. 19 | Initial characteristics | 3.74 | 4.30 | $4.68 \times 10^7$ |
|  | Characteristics after formation of passivation layer | 3.02 | 4.98 | $3.41 \times 10^7$ |
|  | Characteristics after heating | 2.98 | 4.56 | $3.97 \times 10^7$ |

It was demonstrated from the results presented in Tables 10-1 and 10-2 that the transistor normally operated even after the process for forming the passivation layer and the process for heating in any of Examples 6 to 19, indicating high post-process durability. Moreover, output characteristics were measured at an initial stage, after formation of the passivation layer, and after the heating. As a result, a linear correlation was observed between Vds and Ids around Vds~0V at any of the timings. Specifically, it could be confirmed that ohmic contacts were formed between the source electrode and the active layer and between the drain electrode and the active layer.

Example 20

Under the following conditions, a stress test was performed on a transistor which had been produced and had undergone a process for forming a passivation layer in the same manner as in Example 1, to confirm change in transfer characteristics due to the stress.

Specifically, the stress conditions were maintained for $10^5$ seconds where a temperature was set to 50° C., gate voltage (Vg) was set to 20 V, and voltage between the source electrode and the drain electrode (Vds) was set to 20 V. Transfer characteristics were measured in the same manner as described above at each of the following timings: a starting point (0 seconds) of the stress test, and $10^2$ seconds, $10^3$ seconds, $10^4$ seconds, and $10^5$ seconds after application of the stress. A graph of the transfer characteristics is presented in FIG. 24. The values of the field-effect mobility and the threshold voltage are presented in Table 11. Moreover, output characteristics measured after application of the stress for $10^5$ seconds are presented in FIG. 25.

TABLE 11

| Time passed after application of stress | Field-effect mobility μ [cm²/Vs] | Threshold voltage Vth [V] |
|---|---|---|
| 0 seconds | 7.08 | 8.97 |
| $10^2$ seconds | 7.05 | 9.12 |
| $10^3$ seconds | 7.03 | 8.91 |
| $10^4$ seconds | 7.02 | 8.69 |
| $10^5$ seconds | 7.20 | 8.72 |

Figure 24:
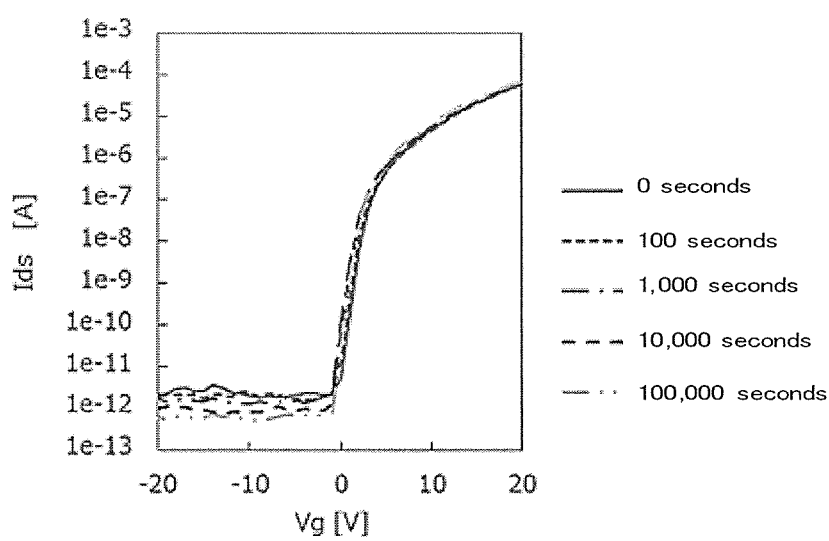
FIG. 24 is a graph presenting transfer characteristics (Vg-Ids characteristics) of a field-effect transistor of Example 1 after a stress test.
Figure 25:
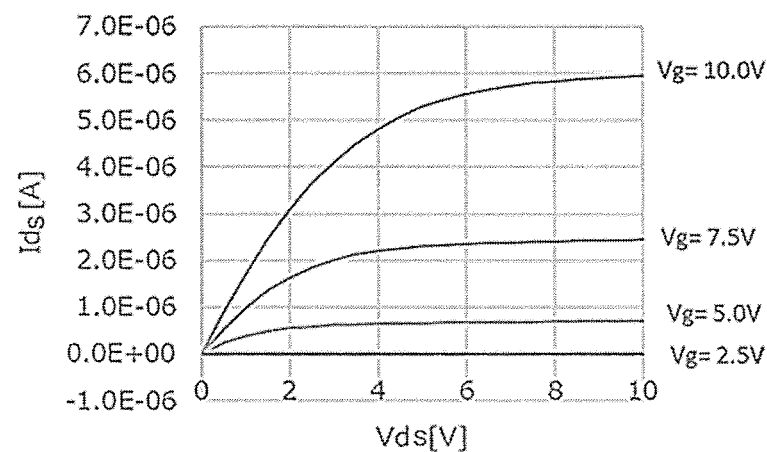
FIG. 25 is a graph presenting output characteristics (Vds-Ids characteristics) of a field-effect transistor of Example 1 after a stress test.

As presented in FIG. 24, the transfer characteristics hardly changed due to application of the stress for $10^5$ seconds. Stability to stress is often evaluated by focusing on a change (Vth shift) of threshold voltage. It was demonstrated from the results presented in Table 11 that change in the threshold voltage was sufficiently small; i.e., ±0.3 V and the transistor of Example 20 had high stability.

Figure 23:
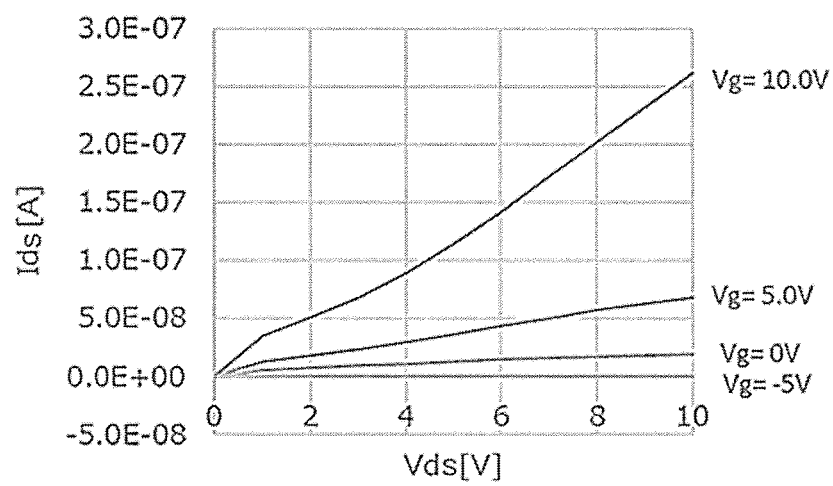
FIG. 23 is a graph presenting output characteristics (Vds-Ids characteristics) of a field-effect transistor of Comparative Example 2 (after annealing)

A linear correlation between Vds and Ids was observed around Vds~0V in the output characteristics presented in FIG. 23. Specifically, it could be confirmed that ohmic contacts were formed between the source electrode and the active layer and between the drain electrode and the active layer, even after application of the stress.

Comparative Example 3

A stress test and measurement of transfer characteristics were performed under the same conditions as in Example 20 on a transistor which had been produced and subjected to a process for forming a passivation layer in the same manner as in Comparative Example 1. A graph of the transfer characteristics is presented in FIG. 26. The values of the field-effect mobility and the threshold voltage are presented in Table 12.

TABLE 12

| Time passed after application of stress | Field-effect mobility μ [cm$^2$/Vs] | Threshold voltage Vth [V] |
|---|---|---|
| 0 seconds | 3.46 | 9.20 |
| 10$^2$ seconds | 3.44 | 9.11 |
| 10$^3$ seconds | 3.21 | 9.48 |
| 10$^4$ seconds | 2.46 | 10.40 |
| 10$^5$ seconds | 1.94 | 10.82 |

Figure 26:
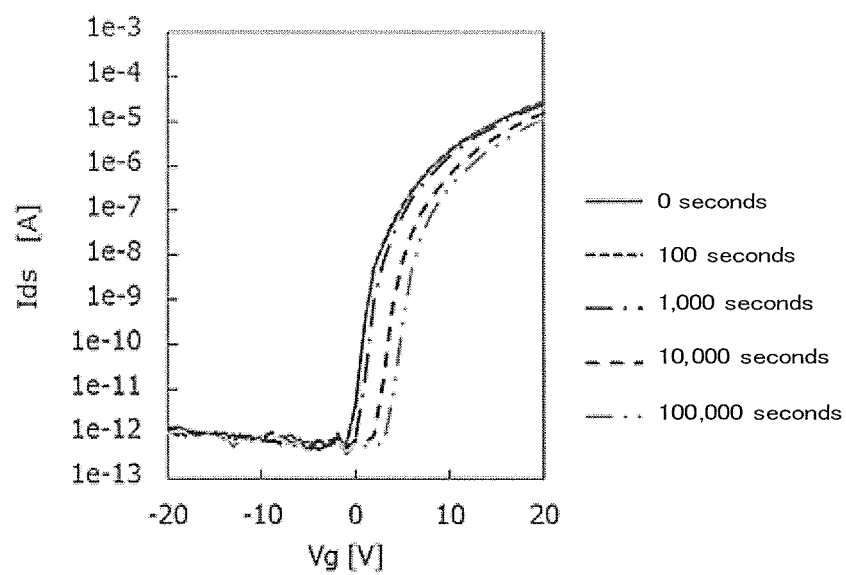
FIG. 26 is a graph presenting transfer characteristics (Vg-Ids characteristics) of a field-effect transistor of Comparative Example 1 after a stress test.

As presented in FIG. 26, the transfer characteristics tended to shift to positive direction along with the application of the stress. According to Table 12, there was a tendency that the value of the threshold voltage monotonically increases as the time passed. After 10$^5$ seconds from the application of the stress, the change was greater than 1.5 V. The change was clearly larger than in Example 20. It was considered that this difference was derived from instability of the active layer; i.e., the characteristics (carrier density) of the active layer were easily changed in Comparative Example 3.

Examples 21 to 23

In the same manners as in Example 7, Example 10, and Example 12, transistors were produced and subjected to a process for forming a passivation layer. A stress test was performed on each of the transistors under the same conditions as in Example 20 to confirm change in transfer characteristics due to stress. Table 13 presents values of the field-effect mobility and threshold voltage of the transistor before application of the stress and after application of the stress for 10$^5$ seconds.

TABLE 13

| | | Before application of stress | | After application of stress | |
|---|---|---|---|---|---|
| | FET Ex. No. | Field-effect mobility μ [cm$^2$/Vs] | Threshold voltage Vth [V] | Field-effect mobility μ [cm$^2$/Vs] | Threshold voltage Vth [V] |
| Ex. 21 | 7 | 2.21 | 6.99 | 2.01 | 7.02 |
| Ex. 22 | 10 | 1.41 | 5.28 | 1.42 | 5.3 |
| Ex. 23 | 12 | 8.12 | 4.79 | 8.11 | 4.79 |

It could be confirmed that the change in the threshold voltage due to application of the stress was sufficiently small and transistor characteristics were stable in any of Examples 21 to 23.

Output characteristics of the field-effect transistors of Examples 21 to 23 were measured after application of the stress for 10$^5$ seconds. As a result, a linear correlation between Vds and Ids was observed around Vds~0V. Specifically, the ohmic contacts between the source electrode and the active layer and between the drain electrode and the active layer could be maintained without being influenced by the stress.

Aspects of the present invention are, for example, as follows.

<1> A field-effect transistor including:
a gate electrode, which is configured to apply gate voltage;
a source electrode and a drain electrode, which are configured to take electric current out;
an active layer, which is disposed to be adjacent to the source electrode and the drain electrode and includes a n-type oxide semiconductor; and
a gate insulating layer, which is disposed between the gate electrode and the active layer,
wherein the n-type oxide semiconductor undergoes substitutional doping with at least one dopant selected from the group consisting of a divalent cation, a trivalent cation, a tetravalent cation, a pentavalent cation, a hexavalent cation, a heptavalent cation, and an octavalent cation,
wherein a valence of the dopant is greater than a valence of a metal ion constituting the n-type oxide semiconductor, provided that the dopant is excluded from the metal ion, and
wherein the source electrode and the drain electrode include a material selected from the group consisting of metals of Au, Pt, and Pd and alloys including at least any one of Au, Pt, and Pd, in at least contact regions of the source electrode and the drain electrode with the active layer.
<2> The field-effect transistor according to <1>,
wherein ohmic contacts are formed between the source electrode and the active layer and between the drain electrode and the active layer.
<3> The field-effect transistor according to <1> or <2>,
wherein a ratio of an amount by mole of the dopant is from 0.01 mol % through 10 mol % when a sum of an amount by mole of the metal ion to be substituted with the dopant in the n-type semiconductor and the amount by mole of the dopant is 100%.
<4> The field-effect transistor according to any one of <1> to <3>,
wherein the metal ion includes an ion of at least one selected from the group consisting of In, Zn, Sn, and Ti.
<5> The field-effect transistor according to <4>, wherein the n-type oxide semiconductor further includes at least one selected from the group consisting of Si, Ge, Zr, Hf, Al, Ga, Sc, Y, La, and alkaline earth metals.
<6> The field-effect transistor according to any one of <1> to <5>, further including an insulating layer disposed on at least one of the source electrode, the drain electrode, and the active layer including the n-type oxide semiconductor.
<7> A display element including:
a light control element configured to control light output according to a driving signal; and
a driving circuit including the field-effect transistor according to any one of <1> to <6> and configured to drive the light control element.
<8> The display element according to <7>,
wherein the light control element includes an electroluminescent element, an electrochromic element, a liquid crystal element, an electrophoretic element, or an electrowetting element.
<9> An image display device configured to display an image corresponding to image data, the image display device including: a plurality of display elements arranged in a form of matrix, each of the plurality of display elements being the display element according to <7> or <8>;

a plurality of wired lines configured to individually apply gate voltage and signal voltage to the field-effect transistors in the plurality of display elements; and a display control device configured to individually control the gate voltage and the signal voltage of the field-effect transistors via the plurality of wired lines according to the image data.

<10> A system including:

the image display device according to <9>; and an image-data-generating device configured to generate image data based on image information to be displayed and to output the image data to the image display device.

<11> A method for producing the field-effect transistor according to any one of <1> to <6>, the method including applying a composition for producing a n-type oxide semiconductor and baking the composition to form the n-type oxide semiconductor, wherein the composition includes a semiconductor-raw-material compound, a dopant-element-including compound, and a solvent, and wherein the semiconductor-raw-material compound includes a metal element constituting the n-type oxide semiconductor, provided that the dopant is excluded from the metal element, and the dopant-element-including compound includes an element to be the dopant.

<12> The method according to <11>, wherein the semiconductor-raw-material compound is at least one selected from the group consisting of inorganic salts, oxides, hydroxides, organic acid salts, organic metals, and metal complexes, and wherein the dopant-element-including compound is at least one selected from the group consisting of inorganic salts, oxides, hydroxides, organic acid salts, organic metals, and metal complexes.

<13> A method for producing the field-effect transistor according to any one of <1> to <6>, the method including applying a coating liquid in a droplet discharge system and baking the coating liquid to form the source electrode and the drain electrode, wherein the coating liquid includes at least one metal compound selected from the group consisting of metal particles, alloy particles, metal complexes, metal salts, and organic metal compounds, and wherein the metal compound includes, as a metal element, at least one selected from the group consisting Au, Pt, and Pd.

What is claimed is:

1. A field-effect transistor comprising:
    a gate electrode, which is configured to apply gate voltage;
    a source electrode and a drain electrode, which are configured to take electric current out;
    an active layer, which is disposed to be adjacent to the source electrode and the drain electrode and includes a n-type oxide semiconductor; and
    a gate insulating layer, which is disposed between the gate electrode and the active layer,
    wherein the n-type oxide semiconductor is substitutionally doped with at least one cation dopant selected from the group consisting of a divalent cation, a trivalent cation, a tetravalent cation, a pentavalent cation, a hexavalent cation, a heptavalent cation, and an octavalent cation,
    wherein the n-type oxide semiconductor includes a metal ion as a component, and a valence of the cation dopant is greater than a valence of the metal ion, and the cation dopant and the metal ion included in the n-type oxide semiconductor are not the same element, and
    wherein the source electrode and the drain electrode include a material selected from the group consisting of the following (i) and (ii), in at least contact regions of the source electrode and the drain electrode with the active layer, the material selected from the group consisting of (i) and (ii) being disposed to be in contact with the n-type oxide semiconductor:
    (i) metals of Au, Pt and Pd; and
    (ii) alloys including at least any one of Au, Pt and Pd.

2. The field-effect transistor according to claim 1,
    wherein ohmic contacts are formed between the source electrode and the active layer and between the drain electrode and the active layer.

3. The field-effect transistor according to claim 1,
    wherein a ratio of an amount by mole of the cation dopant is from 0.01 mol % through 10 mol % when a sum of an amount by mole of the metal ion to be substituted with the cation dopant in the n-type semiconductor and the amount by mole of the cation dopant is 100%.

4. The field-effect transistor according to claim 1, further comprising
    an insulating layer disposed on at least one of the source electrode, the drain electrode, and the active layer including the n-type oxide semiconductor.

5. The field-effect transistor according to claim 1,
    wherein the metal ion includes an ion of at least one selected from the group consisting of In, Zn, Sn, and Ti.

6. The field-effect transistor according to claim 5,
    wherein the n-type oxide semiconductor further includes at least one selected from the group consisting of Si, Ge, Zr, Hf, Al, Ga, Sc, Y, La, and alkaline earth metals.

7. A display element comprising:
    a light control element configured to control light output according to a driving signal; and
    a driving circuit including the field-effect transistor according to claim 1 and configured to drive the light control element.

8. The display element according to claim 7,
    wherein the light control element includes an electroluminescent element, an electrochromic element, a liquid crystal element, an electrophoretic element, or an electrowetting element.

9. An image display device configured to display an image corresponding to image data, the image display device comprising:
    a plurality of display elements arranged in a form of matrix, each of the plurality of display elements being the display element according to claim 7;
    a plurality of wired lines configured to individually apply gate voltage and signal voltage to the field-effect transistors in the plurality of display elements; and
    a display control device configured to individually control the gate voltage and the signal voltage of the field-effect transistors via the plurality of wired lines according to the image data.

10. A system comprising:
    the image display device according to claim 9; and
    an image-data-generating device configured to generate image data based on image information to be displayed and to output the image data to the image display device.

* * * * *